(12) United States Patent
Oh et al.

(10) Patent No.: US 11,195,833 B2
(45) Date of Patent: Dec. 7, 2021

(54) SEMICONDUCTOR DEVICE AND METHOD FOR FABRICATING THE SAME

(71) Applicant: SAMSUNG ELECTRONICS CO., LTD., Suwon-si (KR)

(72) Inventors: Joong Gun Oh, Hwaseong-si (KR); Sung Il Park, Suwon-si (KR); Jae Hyun Park, Hwaseong-si (KR); Hyung Suk Lee, Suwon-si (KR); Eun Sil Park, Hwaseong-si (KR); Yun Il Lee, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 362 days.

(21) Appl. No.: 16/218,796

(22) Filed: Dec. 13, 2018

(65) Prior Publication Data

US 2019/0363085 A1 Nov. 28, 2019

(30) Foreign Application Priority Data

May 25, 2018 (KR) .................. 10-2018-0059734

(51) Int. Cl.
| | |
|---|---|
| *H01L 21/8238* | (2006.01) |
| *H01L 27/092* | (2006.01) |
| *H01L 29/66* | (2006.01) |
| *H01L 29/78* | (2006.01) |
| *H01L 29/06* | (2006.01) |
| *H01L 29/08* | (2006.01) |
| *H01L 21/308* | (2006.01) |

(Continued)

(52) U.S. Cl.
CPC ...... *H01L 27/0924* (2013.01); *H01L 21/3086* (2013.01); *H01L 21/76895* (2013.01); *H01L 21/823821* (2013.01); *H01L 21/823871* (2013.01); *H01L 21/823878* (2013.01); *H01L 29/0642* (2013.01); *H01L 29/0847* (2013.01); *H01L 29/42356* (2013.01); *H01L 29/6656* (2013.01); *H01L 29/66545* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| 9,117,886 B2 | 8/2015 | Lin et al. |
|---|---|---|
| 9,553,090 B2 | 1/2017 | Chang et al. |

(Continued)

*Primary Examiner* — Steven B Gauthier
*Assistant Examiner* — Christopher A Culbert
(74) *Attorney, Agent, or Firm* — Lee IP Law, P.C.

(57) ABSTRACT

A semiconductor device includes a fin type pattern extending in a first direction on a substrate, a first gate electrode extending in a second direction intersecting the first direction on the fin type pattern, a source/drain region on a side wall of the first gate electrode and in the fin type pattern, a separation structure extending in the first direction on the substrate, the separation structure including a first trench and being spaced apart from the fin type pattern and separating the first gate electrode, an interlayer insulating layer on a side wall of the separation structure and covering the source/drain region, the interlayer insulating layer including a second trench having a lower surface lower than a lower surface of the first trench, and a contact connected to the source/drain region and filling the first trench and the second trench.

20 Claims, 33 Drawing Sheets

(51) Int. Cl.
*H01L 29/423* (2006.01)
*H01L 21/768* (2006.01)

(56) References Cited

U.S. PATENT DOCUMENTS

| | | |
|---|---|---|
| 9,559,009 B2 | 1/2017 | Cai et al. |
| 9,773,879 B2 | 9/2017 | Huang et al. |
| 9,780,178 B2 | 10/2017 | Xie et al. |
| 9,806,166 B2 | 10/2017 | Myung et al. |
| 10,832,943 B2 * | 11/2020 | Fan .................. H01L 21/76834 |
| 2016/0284697 A1 | 9/2016 | Yoon et al. |
| 2017/0148682 A1 | 5/2017 | Basker et al. |
| 2017/0154779 A1 | 6/2017 | Hsieh |
| 2017/0154966 A1 | 6/2017 | Huang et al. |
| 2017/0365676 A1 | 12/2017 | Wu et al. |

\* cited by examiner

SEMICONDUCTOR DEVICE AND METHOD FOR FABRICATING THE SAME

CROSS-REFERENCE TO RELATED APPLICATION

Korean Patent Application No. 10-2018-0059734, filed on May 25, 2018, in the Korean Intellectual Property Office, and entitled: "Semiconductor Device and Method for Fabricating the Same," is incorporated by reference herein in its entirety.

BACKGROUND

1. Field

The present disclosure relates to a semiconductor device and a method for fabricating the same. More specifically, the present disclosure relates to a semiconductor device on which a gate cut is implemented, and a method for fabricating the same.

2. Description of the Related Art

As one of scaling techniques for increasing density of an integrated circuit device, a multi-gate transistor, in which a fin-shaped or nanowire-shaped silicon body is formed on a substrate and a gate is formed on a surface of the silicon body, is proposed. Since such a multi-gate transistor utilizes three-dimensional channels, scaling is easily performed. Furthermore, the current control capability may be improved, even without increasing the gate length of the multi-gate transistor. Furthermore, it is possible to effectively suppress a short channel effect (SCE) in which the potential of the channel region is affected by a drain voltage.

SUMMARY

According to aspects of embodiments, there is provided a semiconductor device including a fin type pattern extending in a first direction on a substrate, a first gate electrode extending in a second direction intersecting with the first direction on the fin type pattern, a source/drain region on a side wall of the first gate electrode, in the fin type pattern, a separation structure on the substrate, the separation structure being spaced apart from the fin type pattern and extending in the first direction to separate the first gate electrode, an interlayer insulating layer which covers the source/drain region on a side wall of the separation structure, and a contact connected to the source/drain region on the interlayer insulating layer and the separation structure, wherein the separation structure includes a first trench, the interlayer insulating layer includes a second trench having a lower surface lower than a lower surface of the first trench, and the contact fills the first trench and the second trench.

According to aspects of embodiments, there is also provided a semiconductor device including a first fin type pattern extending in a first direction on a substrate, a second fin type pattern on the substrate, the second fin type pattern being spaced apart from the first fin type pattern and extending in the first direction, a field insulating layer between the first fin type pattern and the second fin type pattern, on the substrate, a separation structure extending in the first direction on the field insulating layer, a first source/drain region on the first fin type pattern, an interlayer insulating layer which covers the first source/drain region, on a side wall of the separation structure, and a contact connected to the first source/drain region, on the interlayer insulating layer and the separation structure, wherein the separation structure includes a first trench having a lower surface lower than an upper surface of the interlayer insulating layer, the interlayer insulating layer includes a second trench having a lower surface lower than a lower surface of the first trench, and the contact fills the first trench and the second trench.

According to aspects of embodiments, there is also provided a semiconductor device including a fin type pattern extending in a first direction on a substrate, a first gate electrode extending in a second direction intersecting with the first direction, on the fin type pattern, a first source/drain region on a side wall of the first gate electrode, in the fin type pattern, a separation structure on the substrate, the separation structure being spaced apart from the fin type pattern and extending in the first direction, and a contact connected to the first source/drain region, on the first source/drain region and the separation structure, wherein the separation structure includes a first separation part which separates the first gate electrode, and a connection part which overlaps the contact, and an upper surface of the connection part is lower than an upper surface of the first separation part.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, semiconductor devices according to some embodiments will be described with reference to FIGS. 1 to 12.

Figure 1:
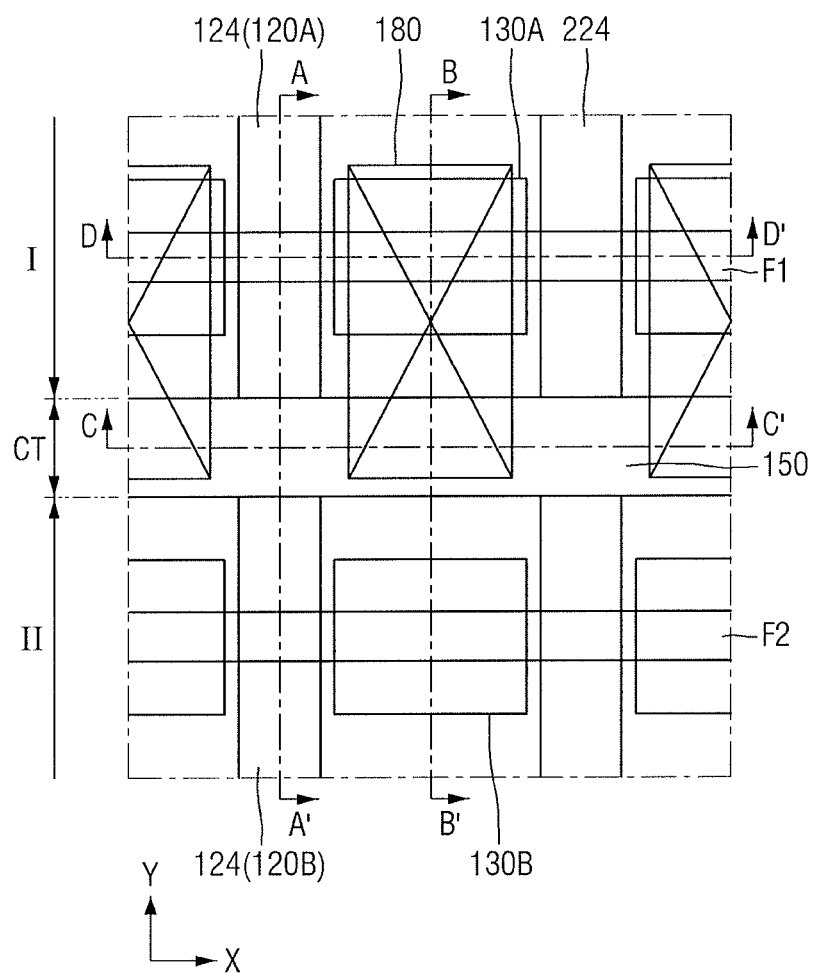
FIG. 1 illustrates a layout diagram of a semiconductor device according to some embodiments.
Figure 2:
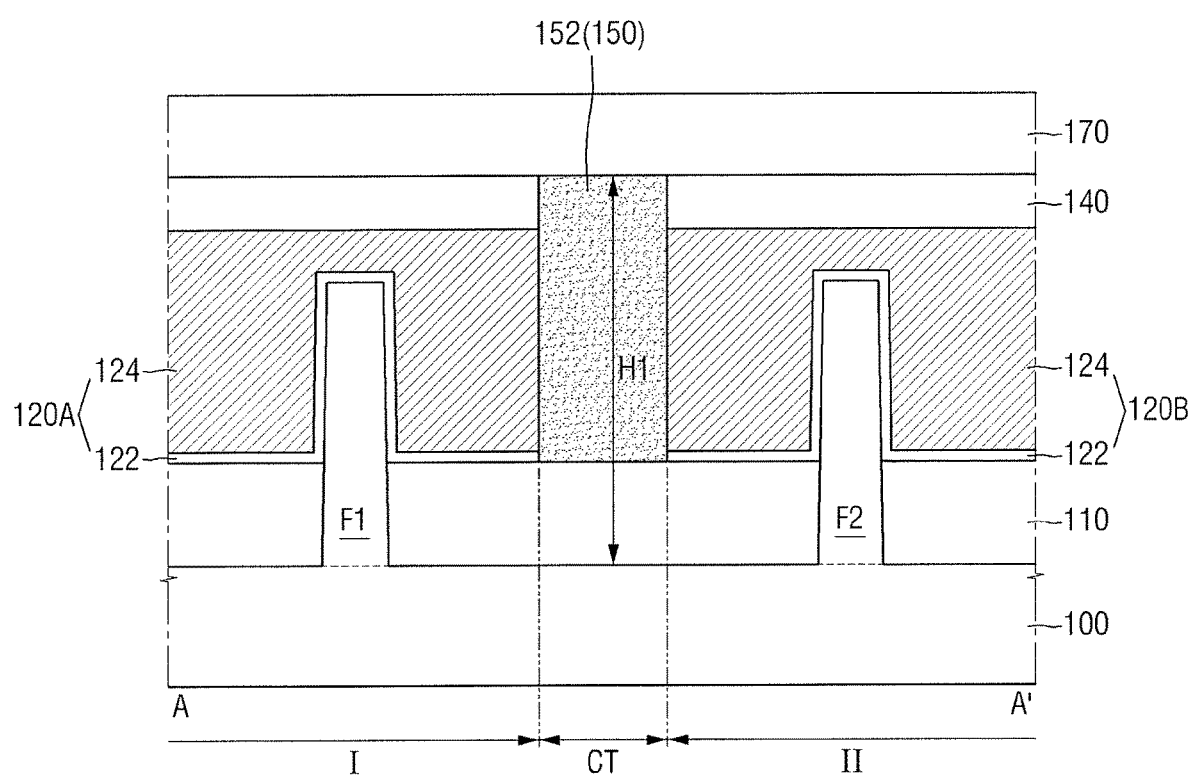
FIG. 2 illustrates a cross-sectional view taken along line A-A' of FIG. 1.
Figure 3:
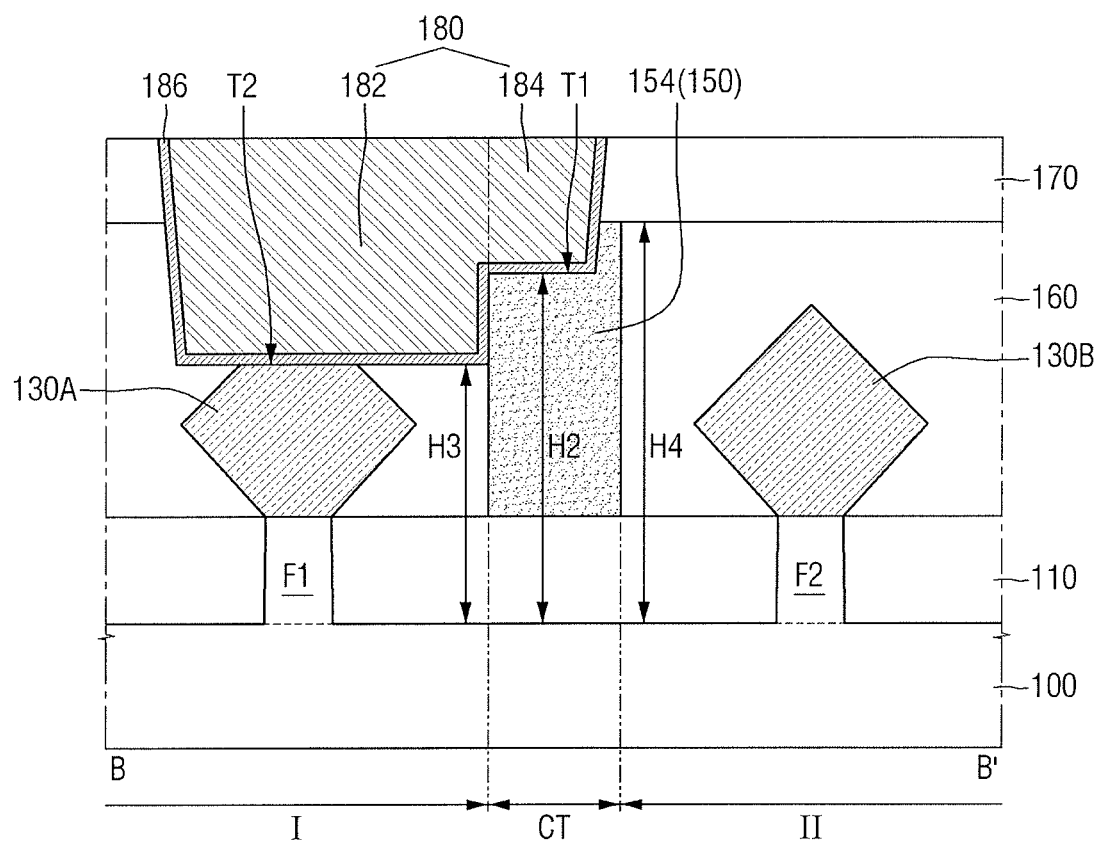
FIG. 3 illustrates a cross-sectional view taken along line B-B' of FIG. 1.
Figure 4:
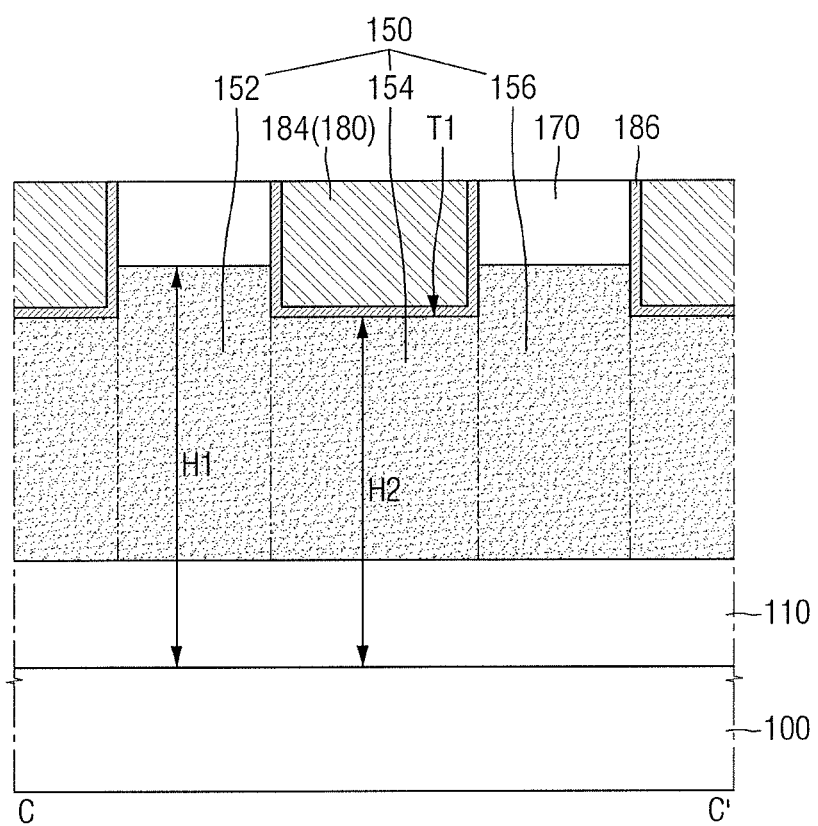
FIG. 4 illustrates a cross-sectional view taken along line C-C' of FIG. 1.
Figure 5:
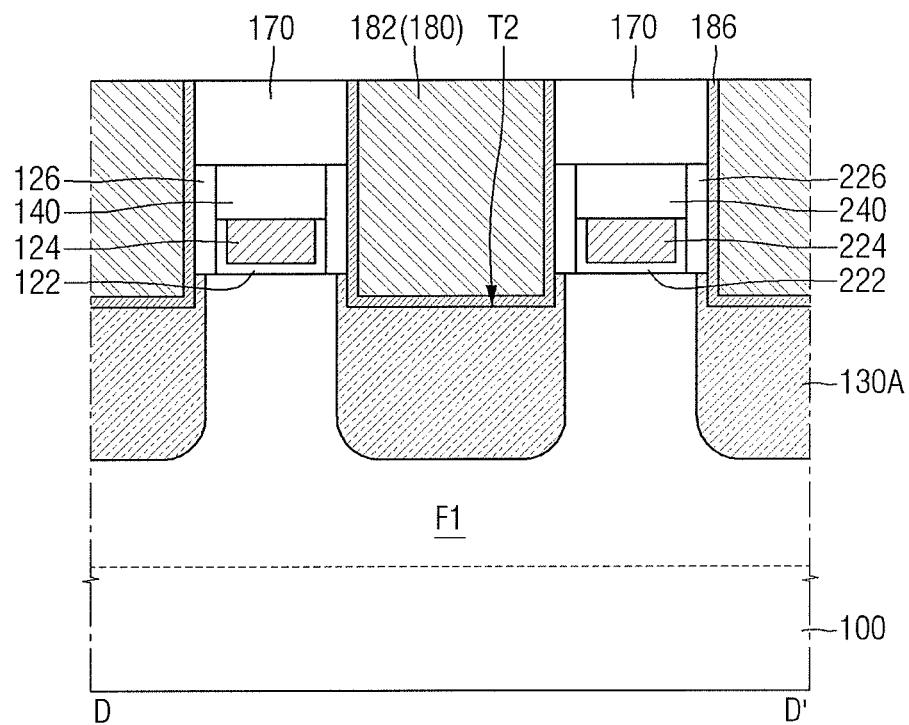
FIG. 5 illustrates a cross-sectional view taken along line D-D' of FIG. 1.

FIG. 1 is a layout diagram of a semiconductor device according to some embodiments. FIG. 2 is a cross-sectional view taken along line A-A' of FIG. 1. FIG. 3 is a cross-sectional view taken along line B-B' of FIG. 1. FIG. 4 is a cross-sectional view taken along line C-C' of FIG. 1. FIG. 5 is a cross-sectional view taken along line D-D' of FIG. 1.

Referring to FIGS. 1 to 5, a semiconductor device according to some embodiments may include a substrate 100, a first fin type pattern F1, a second fin type pattern F2, a field insulating layer 110, a first gate dielectric layer 122, a first gate electrode 124, a first gate spacer 126, a first capping pattern 140, a first source/drain region 130A, a second gate dielectric layer 222, a second gate electrode 224, a second gate spacer 226, a second capping pattern 240, a second source/drain region 130B, an interlayer insulating layer 160, a separation structure 150, a hard mask layer 170, and a contact 180.

The substrate 100 may be, e.g., bulk silicon or silicon-on-insulator (SOI). For example, the substrate 100 may be a silicon substrate or may include other materials, e.g., silicon germanium, indium antimonide, lead tellurium compounds, indium arsenide, indium phosphide, gallium arsenide or gallium antimonide. In another example, the substrate 100 may have an epitaxial layer formed on a base substrate. For convenience of explanation, the substrate 100 is illustrated as a silicon substrate below.

The substrate 100 may include a first region I, a separation region CT, and a second region II. The separation region CT may be interposed between the first region I and the second region II, e.g., in a second direction Y. For example, as illustrated in FIG. 1, the first region I and the second region II may be spaced apart from each other by the separation region CT.

The first fin type pattern F1 and the second fin type pattern F2 may protrude from the substrate 100 to extend long. For example, the first fin type pattern F1 and the second fin type pattern F2 may have short sides and long sides, respectively. In FIG. 1, the long side of the first fin type pattern F1 and the long side of the second fin type pattern F2 are illustrated as extending in a first direction X. That is, the first fin type pattern F1 and the second fin type pattern F2 may extend long in the first direction X on the substrate 100, e.g., the first fin type pattern F1 and the second fin type pattern F2 may have longitudinal directions, i.e., long sides, extending along the first direction X.

The first fin type pattern F1 and the second fin type pattern F2 may extend to be spaced apart from each other, e.g., along the second direction Y. For example, the first fin type pattern F1 may be formed on the first region I of the substrate 100, and the second fin type pattern F2 may be formed on the second region II of the substrate 100.

The first fin type pattern F1 and the second fin type pattern F2 may be parts of the substrate 100 and may include an epitaxial layer grown from the substrate 100. The first fin type pattern F1 and the second fin type pattern F2 may include, e.g., silicon or germanium which are element semiconductor materials. The first fin type pattern F1 and the second fin type pattern F2 may include a compound semiconductor, e.g., a group IV-IV compound semiconductor or a group III-V compound semiconductor.

For example, when the first fin type pattern F1 and the second fin type pattern F2 include the group IV-IV compound semiconductor, the first fin type pattern F1 and the second fin type pattern F2 may include a binary compound or a ternary compound containing at least two or more of, e.g., carbon (C), silicon (Si), germanium (Ge), and tin (Sn), or a compound obtained by doping these elements with a group IV element. In another example, when the first fin type pattern F1 and the second fin type pattern F2 include the group III-V compound semiconductors, the first fin type pattern F1 and the second fin type pattern F2 may include one of a binary compound, a ternary compound or a quaternary compound formed by combination of at least one of, e.g., aluminum (Al), gallium (Ga) and indium (In) as a group III element, and one of phosphorus (P), arsenic (As) and antimony (Sb) as a group V element.

The field insulating layer 110 may be formed on the substrate 100. Further, the field insulating layer 110 may surround a part of the first fin type pattern F1 and a part of the second fin type pattern F2. For example, as illustrated in FIG. 2, the field insulating layer 110 may wrap a part of the side wall of the first fin type pattern F1 and a part of the side wall of the second fin type pattern F2.

In FIG. 3, the upper surface of the field insulating layer 110 is illustrated as having the same height as the upper surface of a part of the first fin type pattern F1 and the upper surface of a part of the second fin type pattern F2, but the present disclosure is not limited thereto. For example, in FIG. 2, the first fin type pattern F1 and the second fin type pattern F2 may protrude above the field insulating layer 110.

The first gate electrode 124 may be formed on the first fin type pattern F1 and the second fin type pattern F2. Further, the first gate electrode 124 may intersect with the first fin type pattern F1 and the second fin type pattern F2. For example, the first gate electrode 124 may extend long in the second direction Y intersecting with the first direction X, e.g., a longitudinal direction of the first gate electrode 124 may extend in the second direction Y. In some embodiments, as illustrated in FIG. 2, the upper surface of the first gate electrode 124 may be higher than each of the upper surface of the first fin type pattern F1 and the upper surface of the second fin type pattern F2.

As illustrated in FIGS. 1 and 5, the second gate electrode 224 may be spaced apart from the first gate electrode 124, e.g., in the first direction X, to extend long in the second direction Y, e.g., a longitudinal direction of the second gate electrode 224 may extend in the second direction Y. Like the first gate electrode 124, the second gate electrode 224 may be formed on the first fin type pattern F1 and the second fin type pattern F2. Further, the second gate electrode 224 may intersect with the first fin type pattern F1 and the second fin type pattern F2. In some embodiments, the second gate electrode 224 may be formed at the same level as the first gate electrode 124. In the present specification, "the same level" means formation obtained by the same fabricating process.

The first gate electrode 124 and the second gate electrode 224 may include a conductive material. For example, the first gate electrode 124 and the second gate electrode 224 may include a metal layer. For example, the first gate electrode 124 and the second gate electrode 224 may each include at least one of Ti, Ta, W, Al, Co and combinations thereof. However, the present disclosure is not limited thereto, and the first gate electrode 124 and the second gate electrode 224 may be made of, e.g., silicon, silicon germanium or the like other than metal.

The first gate electrode 124 and the second gate electrode 224 are illustrated as a single layer, but the present disclosure is not limited thereto. For example, the first gate electrode 124 and the second gate electrode 224 may be formed by stacking a plurality of conductive materials. For example, each of the first gate electrode 124 and the second gate electrode 224 may include a work function adjusting layer for adjusting a work function, and a filling conductive layer for filling a space formed by the work function adjusting layer. The work function adjusting layer may include, e.g., at least one of TiN, TaN, TiC, TaC, TiAlC, and combinations thereof. The filling conductive layer may include, e.g., W or Al.

The first gate electrode 124 and the second gate electrode 224 may be formed, e.g., through a replacement process, but the present disclosure is not limited thereto.

The first gate dielectric layer 122 may be interposed between the substrate 100 and the first gate electrode 124. For example, as illustrated in FIG. 2, the first gate dielectric layer 122 may extend along a profile of the upper surface of the field insulating layer 110 and profiles of the fin type patterns (e.g., a first fin type pattern F1 and a second fin type pattern F2) exposed by the field insulating layer 110. However, in some embodiments, the first gate dielectric layer 122 may not extend along the side walls of the separation structure 150. Also, as illustrated in FIG. 5, in some embodiments, the first gate dielectric layer 122 may extend along at least a part of the side walls of the first gate spacer 126.

The second gate dielectric layer 222 may be interposed between the substrate 100 and the second gate electrode 224. Like the first gate dielectric layer 122, the second gate dielectric layer 222 may extend along a profile of the upper surface of the field insulating layer 110, and profiles of the fin type patterns (e.g., the first fin type pattern F1 and the second fin type pattern F2) exposed by the field insulating layer 110. However, in some embodiments, the second gate dielectric layer 222 may not extend along the side walls of the separation structure 150. In some embodiments, the second gate dielectric layer 222 may be formed at the same level as the first gate dielectric layer 122. Also, as illustrated in FIG. 5, in some embodiments, the second gate dielectric layer 222 may extend along at least a part of the side walls of the second gate spacer 226.

For example, the first gate dielectric layer 122 and the second gate dielectric layer 222 may include at least one of silicon oxide ($SiO_2$), silicon oxynitride (SiON), silicon nitride (SiN) or a high dielectric constant (high-k) material having a dielectric constant greater than that of silicon oxide ($SiO_2$). The high dielectric constant material may include, e.g., at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof.

The first capping pattern 140 may be formed on the first gate electrode 124. Further, the first capping pattern 140 may intersect with the first fin type pattern F1 and the second fin type pattern F2. For example, the first capping pattern 140 may extend long in the second direction Y.

The second capping pattern 240 may be formed on the second gate electrode 224. Further, the second capping pattern 240 may intersect with the first fin type pattern F1 and the second fin type pattern F2. For example, the second capping pattern 240 may extend long in the second direction Y. In some embodiments, the second capping pattern 240 may be formed at the same level as the first capping pattern 140.

The first capping pattern 140 and the second capping pattern 240 may include an insulating material. For example, the first capping pattern 140 and the second capping pattern 240 may include silicon nitride.

As illustrated in FIG. 5, the first gate spacer 126 may be formed on both side walls of the first gate electrode 124. Thus, the first gate spacer 126 may intersect with the first fin type pattern F1 and the second fin type pattern F2. For example, the first gate spacer 126 may extend long in the second direction Y on the substrate 100 and the field insulating layer 110.

In some embodiments, the first gate spacer 126 may be formed on the side walls of the first gate dielectric layer 122 and the side walls of the first capping pattern 140. Accordingly, the first gate electrode 124, the first gate dielectric layer 122, and the first capping pattern 140 may fill a trench defined by the first gate spacer 126.

For example, as illustrated in FIG. 5, a trench defined by the side walls of the first gate spacer 126 and the upper surface of the first fin type pattern F1 may be formed. Since the first gate spacer 126 may intersect with the first fin type pattern F1 and the second fin type pattern F2, the trench may also intersect with the first fin type pattern F1 and the second fin type pattern F2. In some embodiments, the first gate electrode 124 and the first gate dielectric layer 122 may be formed to fill a part of the trench. Further, the first capping pattern 140 may be formed to fill the remaining part of the trench.

In some embodiments, the first capping pattern 140 may also be omitted. In such a case, the first gate electrode 124 and the first gate dielectric layer 122 may be formed to fill the overall trench.

The second gate spacer 226 may be formed on both side walls of the second gate electrode 224. Accordingly, the second gate spacer 226 may intersect with the first fin type pattern F1 and the second fin type pattern F2. For example, the second gate spacer 226 may extend long in the second direction Y on the substrate 100 and the field insulating layer 110.

Also, like the first gate spacer 126, the second gate spacer 226 may be formed on the side wall of the second gate dielectric layer 222 and the side wall of the second capping pattern 240. Accordingly, the second gate electrode 224, the second gate dielectric layer 222, and the second capping pattern 240 may fill a trench defined by the second gate spacer 226.

The first gate spacer 126 and the second gate spacer 226 are illustrated as a single layer, but the present disclosure is not limited thereto. For example, the first gate spacer 126 or the second gate spacer 226 may be formed of multi-layers, respectively.

The first gate spacer 126 and the second gate spacer 226 may include, e.g., at least one of silicon nitride (SiN), silicon oxynitride (SiON), silicon oxide ($SiO_2$), silicon oxycarbo nitride (SiOCN) and a combination thereof. In another example, the first gate spacer 126 and the second gate spacer 226 may include a low dielectric constant (low-k) material having a lower dielectric constant than that of silicon oxide.

A first source/drain region 130A may be formed in the first fin type pattern F1 on both sides of the first gate electrode 124. However, the first source/drain region 130A may be insulated from the first gate electrode 124 by the first gate spacer 126. As a result, the first source/drain region 130A may function as a source/drain of the transistor including the first fin type pattern F1 and the first gate electrode 124.

A second source/drain region 130E may be formed in the second fin type pattern F2 on both sides of the first gate electrode 124. However, the second source/drain region 130B may be insulated from the first gate electrode 124 by the first gate spacer 126. As a result, the second source/drain region 130E may function as a source/drain of the transistor including the second fin type pattern F2 and the first gate electrode 124.

In some embodiments, the first source/drain region 130A and the second source/drain region 130B may be formed by an epitaxial growth method. For example, as illustrated in FIG. 5, the first source/drain region 130A may be formed by an epitaxial growth method to fill the trench in the first fin type pattern F1.

In some embodiments, the first source/drain region 130A and the second source/drain region 130B may be a raised source/drain. For example, as illustrated in FIG. 5, an uppermost part of the first source/drain region 130A may protrude upward from the upper surface of the first fin type pattern F1. Also, in some embodiments, the first source/drain region 130A or the second source/drain region 130B may be a shared source/drain common to the plurality of gate electrodes.

The first source/drain region 130A and the second source/drain region 130B are illustrated as single layers, but the present disclosure is not limited thereto. For example, the first source/drain region 130A or the second source/drain region 130B may be formed of multi-layers each containing impurities of different concentrations.

In FIG. 3, a cross-section of the first source/drain region 130A and a cross-section of the second source/drain region 130B are illustrated as having a pentagonal shape, but the present disclosure is not limited thereto. The cross-section of the first source/drain region 130A and the cross-section of the second source/drain region 130B may have various shapes, e.g., a diamond shape (or a hexagonal shape).

In the case where the semiconductor element to be formed is a PMOS transistor, the first source/drain region 130A or the second source/drain region 130B may include a p-type impurity or an impurity for preventing diffusion of the p-type impurity. For example, the first source/drain region 130A or the second source/drain region 130B may include at least one of B, C, In, Ga, and Al or combinations thereof.

Further, in a case where the semiconductor element to be formed is a PMOS transistor, the first source/drain region 130A or the second source/drain region 130B may include a compressive stress material. For example, when the first fin type pattern F1 is silicon (Si), the first source/drain region 130A or the second source/drain region 130B may include a material having a lattice constant greater than Si, e.g., silicon germanium (SiGe). The compressive stress material may apply a compressive stress to the first fin type pattern F1 to improve mobility of carriers in the channel region.

On the other hand, when the semiconductor element to be formed is an NMOS transistor, the first source/drain region 130A or the second source/drain region 130B may include an n-type impurity or an impurity for preventing diffusion of the n-type impurity. For example, the first source/drain region 130A or the second source/drain region 130B may include at least one of P, Sb, As, or combinations thereof.

Further, when the semiconductor element to be formed is an NMOS transistor, the first source/drain region 130A or the second source/drain region 130B may include a tensile stress material. For example, when the first fin type pattern F1 is silicon (Si), the first source/drain region 130A or the second source/drain region 130B may contain materials with a lattice constant smaller than silicon (Si), e.g., silicon carbide (SiC). The tensile stress material may apply a tensile stress to the first fin type pattern F1 to improve the mobility of carriers in the channel region.

In some embodiments, the semiconductor elements of the same conductivity type may be formed in the first region I and the second region II. For example, the first source/drain region 130A and the second source/drain region 130B may contain impurities of the same conductivity type. However, the present disclosure is not limited thereto, and semiconductor elements of different conductivity types may be formed in the first region I and the second region II.

The interlayer insulating layer 160 may be formed on the substrate 100 and the field insulating layer 110. Further, the interlayer insulating layer 160 may be formed to fill the peripheral space. For example, as illustrated in FIG. 3, the interlayer insulating layer 160 may cover the first source/drain region 130A and the second source/drain region 130B.

The interlayer insulating layer 160 may include, e.g., at least one of silicon oxide, silicon nitride, silicon oxynitride and low dielectric constant (low-k) material having lower dielectric constant than that of silicon oxide. The low dielectric constant material may include, but is no limited to, e.g., at least one of FOX (Flowable Oxide), TOSZ (Torene SilaZene), USG (Undoped Silica Glass), BSG (Borosilica Glass), PSG (PhosphoSilica Glass), BPSG (Boro Phospho Silica Glass), PETEOS (Plasma Enhanced Tetra Ethyl Ortho Silicate), FSG (Fluoride Silicate Glass), CDO (Carbon Doped Silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material, and combinations thereof.

The separation structure 150 may be formed on the separation region CT of the substrate 100. For example, as illustrated in FIGS. 2 and 3, the separation structure 150 may be formed on the field insulating layer 110 between the first fin type pattern F1 and the second fin type pattern F2.

In FIGS. 2 and 3, the separation structure 150 is illustrated to have a rectangular shape, but the present disclosure is not limited thereto. For example, the separation structure 150 may also have a tapered shape. For example, unlike the configuration illustrated in FIGS. 2 and 3, the width of the separation structure 150 may gradually increase as it goes away from the upper surface of the substrate 100. The shape of the separation structure 150 may be due to the characteristics of the etching process for forming the separation structure 150, but is not limited thereto.

The separation structure 150 may separate the first gate electrode 124, the first gate dielectric layer 122, the second gate electrode 224, and the second gate dielectric layer 222. For example, as illustrated in FIGS. 1 and 2, the separation structure 150 may extend in the first direction X to separate the first gate electrode 124 and the first gate dielectric layer 122. The first gate electrode 124 may be physically and electrically separated by the separation structure 150, e.g., the first gate electrode 124 may be physically separated by the separation structure 150 into two portions adjacent to each other in the second Y direction.

For example, the two portions of the first gate electrode 124 that are separated from each other by the separation structure 150 may be a first gate structure 120A and a second gate structure 120B, respectively, that are formed by the separation of the first gate electrode 124 and the first gate dielectric layer 122. The first gate structure 120A may be the first gate dielectric layer 122 and the first gate electrode 124 extending in the second direction Y on the first region I of the substrate 100. The second gate structure 120B may be the first gate dielectric layer 122 and the first gate electrode 124 extending in the second direction Y on the second region II of the substrate 100. That is, the separation structure 150 may be interposed between the first gate structure 120A and the second gate structure 120B to separate therebetween.

Further, the separation structure 150 may separate the interlayer insulating layer 160. For example, as illustrated in FIGS. 1 and 3, the separation structure 150 may extend in the first direction X to separate the interlayer insulating layer 160. The interlayer insulating layer 160 may be physically separated by the separation structure 150. Therefore, the interlayer insulating layer 160 may be disposed on both side walls of the separation structure 150.

The separation structure 150 may include an insulating material. For example, the separation structure 150 may include a material different from the interlayer insulating layer 160. For example, the separation structure 150 may include a material having a lower etching rate than the interlayer insulating layer 160, e.g., the separation structure 150 may include silicon nitride.

As illustrated in FIG. 4, the separation structure 150 may include a first separation part 152, a connection part 154, and a second separation part 156. The first separation part 152 may be a part of the separation structure 150 that separates the first gate electrode 124. The second separation part 156 may be a part of the separation structure 150 that separates the second gate electrode 224. The connection part 154 may connect the first separation part 152 and the second separation part 156. Further, the connection part 154 may be a part of the separation structure 150 that separates the interlayer insulating layer 160.

In some embodiments, the height of the first separation part 152 and the height of the second separation part 156 may be substantially the same as the height of the first capping pattern 140 and the height of the second capping pattern 240. In the present specification, the "height" means the height based on the upper surface of the substrate 100. Further, in this specification, "the same" means not only completely the same thing but also a fine difference which may occur due to a process margin or the like. For example, as illustrated in FIG. 2, the first height H1 of the upper surface of the first separation part 152 may be substantially the same as the height of the upper surface of the first capping pattern 140, e.g., upper surfaces of the first separation part 152 and the first capping pattern 140 may be substantially level with each other. As a result, in the separation region CT, the first capping pattern 140 may be physically separated by the separation structure 150.

In some embodiments, the height of the connection part 154 may be lower than the height of the first separation part 152 and the height of the second separation part 156. For example, as illustrated in FIG. 4, the second height H2 of the upper surface of the connection part 154 may be lower than the first height H1 of the upper surface of the first separation part 152. As a result, the upper surface of the separation structure 150 may have an irregular shape, e.g., the upper surface of the separation structure 150 may be non-flat along the first direction X to have alternating up-down steps.

For example, the separation structure 150 may include a first trench T1 therein, e.g., the connection part 154 of the separation structure 150 may include the first trench T1 therein. The first trench T1 may be formed by etching a part of the upper part of the separation structure 150, e.g., so a portion of the separation structure 150 with the first trench T1 may have a lower upper surface than a portion of the separation structure 150 without the first trench T1. That is, the lower surface of the first trench T1 may define the upper surface of the connection part 154, so the lower surface of the first trench T1 may have the second height H2. For example, as illustrated in FIG. 4, the lower surface of the first trench T1 (i.e., height H2) may be lower than the upper surface of the separation structure 150 without the first trench T1 (i.e., height H1) to define the alternating up-down steps.

The lower surface of the first trench T1 may be lower than the upper surface of the interlayer insulating layer 160. For example, as illustrated in FIG. 3, the second height H2 of the lower surface of the first trench T1 may be lower than a fourth height H4 of the upper surface of the interlayer insulating layer 160. For example, the fourth height H4 of the upper surface of the interlayer insulating layer 160 may be substantially the same as the first height H1 of the upper surface of the separation structure 150. Since the first trench T1 may be formed by etching a part of the upper part of the separation structure 150, the lower surface of the first trench T1 may be lower than the upper surface of the interlayer insulating layer 160.

The interlayer insulating layer 160 may include a second trench T2 therein. The second trench T2 may be formed by etching a part of the upper part of the interlayer insulating layer 160 of the first region I. Further, the second trench T2 may be connected to the first trench T1, and may expose the first source/drain region 130A.

The lower surface of the first trench T1 may be higher the lower surface of the second trench T2, e.g., relative to a bottom of the substrate 100. For example, as illustrated in FIG. 3, the second height H2 of the lower surface of the first trench T1 may be higher than the third height H3 of the lower surface of the second trench T2.

In some embodiments, the second trench T2 may be formed by etching a part of the upper part of the first source/drain region 130A. In FIG. 3, the upper surface of the first source/drain region 130A exposed by the second trench T2 is illustrated as being located on the same plane as the upper surface of the interlayer insulating layer 160 exposed by the second trench T2, but the present disclosure is not limited thereto. For example, the upper surface of the first source/drain region 130A exposed by the second trench T2 may be higher or lower than the upper surface of the interlayer insulating layer 160 exposed by the second trench T2, depending on the characteristics of the etching process of forming the second trench T2.

The contact 180 may be formed so as to be electrically connected to the first source/drain region 130A. For example, the contact 180 may extend through the interlayer insulating layer 160 to be connected to the first source/drain region 130A. Further, the contact 180 may be formed to overlap at least a part of the separation structure 150. Thus, the contact 180 may be formed over the first region I and the separation region CT.

For example, referring to FIG. 3, the contact 180 for filling the second trench T2 of the interlayer insulating layer 160 and the first trench T1 of the separation structure 150 may be formed. As a result, the connection part 154 of the separation structure 150 may overlap the contact 180. Further, the first separation part 152 and the second separation part 156 of the separation structure 150 may not overlap the contact 180.

Also, the contact 180 may include a first part 182 filling the second trench T2 and a second part 184 filling the first trench T1, e.g., the first and second parts 182 and 184 may be in contact and continuous with each other. The first part 182 of the contact 180 may extend through the interlayer insulating layer 160 on the first region I to be connected to the first source/drain region 130A. Also, the second part 184 of the contact 180 may be disposed on the separation structure 150. Since the second height H2 of the lower surface of the first trench T1 is higher than the third height H3 of the lower surface of the second trench T2, a depth of the second part 184 may be formed to be shallower than a depth of the first part 182. The contact 180 may include, but is not limited to, e.g., W, Al, Cu, or the like.

The semiconductor device according to some embodiments may further include a barrier metal layer 186. The barrier metal layer 186 may extend along the lower surface and the side wall of the first trench T1, and the lower surface and the side wall of the second trench T2. For example, as illustrated in FIG. 3, the barrier metal layer 186 may extend continuously and conformally along sidewalls and lower surfaces of combined profiles of the first and second trenches T1 and T2. In such a case, the contact 180 may be formed on the barrier metal layer 186. That is, the contact 180 may be formed to fill the regions of the first trench T1 and the second trench T2 that are left after the barrier metal layer 186 is formed. The barrier metal layer 186 may include, but is not limited to, e.g., Ti or TiN.

The semiconductor device according to some embodiments may further include a hard mask layer 170. The hard mask layer 170 may be disposed on the interlayer insulating layer 160, the separation structure 150, the first capping pattern 140, and the second capping pattern 240. In such a case, the first part 182 of the contact 180 may extend through the hard mask layer 170 and through the interlayer insulating layer 160 to be connected to the first source/drain region 130A. Also, the second part 184 of the contact 180 may extend through the hard mask layer 170 to be disposed on the separation structure 150. The hard mask layer 170 may include, but is not limited to, e.g., TEOS (tetraethyl orthosilicate).

A gate cut may be used to implement semiconductor elements separated from each other. For example, a structure for cutting the gate electrode is formed, and the gate cut may be implemented. Therefore, the semiconductor device according to some embodiments may prevent the formation of an excessive size of the source/drain contact in the separation region CT, using the separation structure 150 which separates the gate electrode and the interlayer insulating layer, in the separation region CT in which the gate cut is implemented.

For example, depending on the design of the semiconductor, an extended form of source/drain contact formed over the first region I and the separation region CT may be required. If the interlayer insulating layer 160 remains on the separation region CT, the interlayer insulating layer 160 on the separation region CT may be excessively etched in the process of forming the contact hole for the source/drain contact. Accordingly, an excessively large size of the source/drain contact may be formed on the separation region CT, which may increase the parasitic capacitance in a relation with the adjacent contact, e.g., the contact formed in the second region II).

In contrast, in the semiconductor device according to embodiments, by replacing the interlayer insulating layer above the separation region CT with the separation structure 150, it is possible to prevent an excessive size of source/drain contact from being formed on the separation region CT. For example, in the etching process of forming the contact hole (e.g., CH in FIGS. 35 to 38) for the contact 180, the separation structure 150 may have a higher etching resistance than the interlayer insulating layer 160. Thus, the second part 184 of the contact 180 on the separation region CT may be formed to a shallower depth than the first part 182 of the contact 180 on the first region I. As a result, a parasitic capacitance between the contact 180 and the contacts (e.g., a contact formed in the second region II) adjacent thereto may be reduced, and a semiconductor device with improved performance may be provided.

Figure 6A:
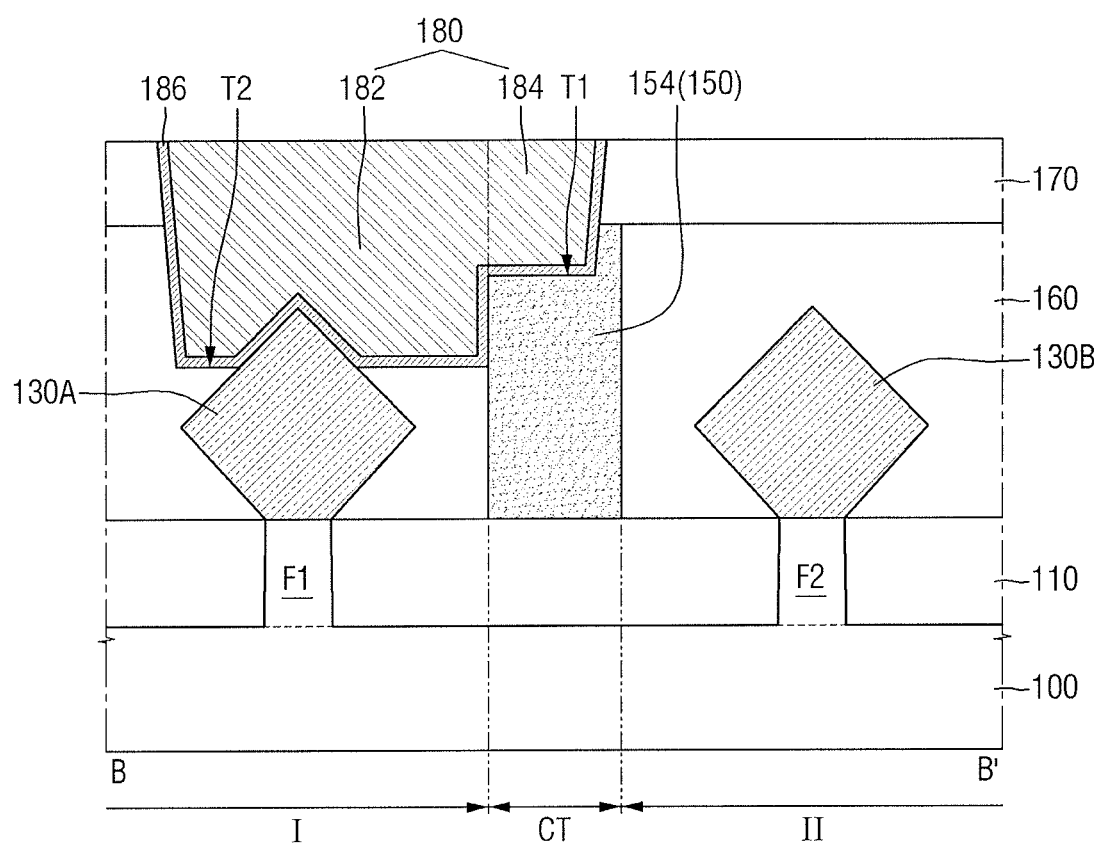
FIG. 6A illustrates a cross-sectional view of a semiconductor device according to some embodiments.

FIG. 6A is a cross-sectional view of a semiconductor device according to some embodiments. For the sake of convenience of explanation, repeated parts of those described with reference to FIGS. 1 to 5 will be only briefly described or omitted. It is noted that the view in FIG. 6A corresponds to that of FIG. 3 (i.e., along line B-B' of FIG. 1).

Referring to FIG. 6A, in the semiconductor device according to some embodiments, the first source/drain region 130A exposed by the second trench T2 protrudes from, e.g., above, the upper surface of the interlayer insulating layer 160 exposed by the second trench T2. For example, the second trench T2 may be formed by etching a part of the upper part of the interlayer insulating layer 160, while the upper part of the first source/drain region 130A may not be etched. In some embodiments, a part of the barrier metal layer 186 may extend along the profile of the first source/drain region 130A exposed by the second trench T2.

Figure 6B:
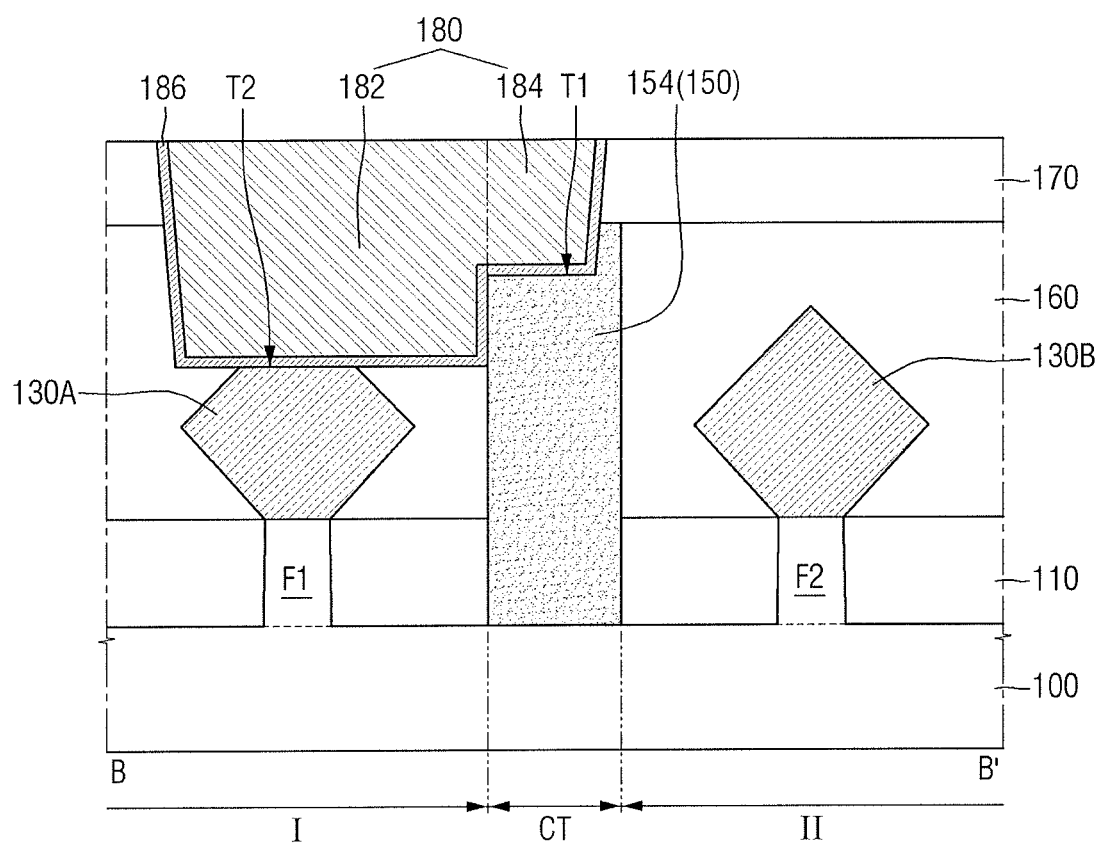
FIG. 6B illustrates a cross-sectional view of a semiconductor device according to some embodiments.

FIG. 6B is a cross-sectional view illustrating the semiconductor device according to some embodiments. For the sake of convenience of explanation, repeated parts of those described with reference to FIGS. 1 to 5 will be only briefly described or omitted. It is noted that the view in FIG. 6B corresponds to that of FIG. 3 (i.e., along line B-B' of FIG. 1)

Referring also to FIG. 6B, in the semiconductor device according to some embodiments, the lower surface of the separation structure 150 is formed to be lower than the upper surface of the field insulating layer 110. For example, at least a part of the field insulating layer 110 of the separation region CT may be etched, and the lower part of the separation structure 150 may be formed to fill the region of the etched field insulating layer 110. In some embodiments, as illustrated, the separation structure 150 may pass through the field insulating layer 110. Therefore, in some embodiments, the separation structure 150 may be in contact with the upper surface of the substrate 100.

The lower surface of the separation structure 150 is illustrated as being disposed on the same plane as the upper surface of the substrate 100, but the present disclosure is not limited thereto. In some embodiments, the lower part of the separation structure 150 may be formed in the form of being embedded in the substrate 100. For example, a part of the substrate 100 in the separation region CT may be etched, and the lower part of the separation structure 150 may be formed to fill the region of the etched substrate 100. Thus, in some embodiments, the lower surface of the separation structure 150 may be formed to be lower than the uppermost surface of the substrate 100.

In some embodiments, the lower part of the separation structure 150 may be formed in the form of being embedded in the field insulating layer 110. For example, unlike the illustrated configuration, a part of the field insulating layer 110 of the separation region CT may be etched, and the lower part of the separation structure 150 may be formed to fill the region of the etched field insulating layer 110. Therefore, in some embodiments, the lower surface of the separation structure 150 may be formed to be higher than the upper surface of the substrate 100 and lower than the uppermost surface of the field insulating layer 110.

Figure 7:
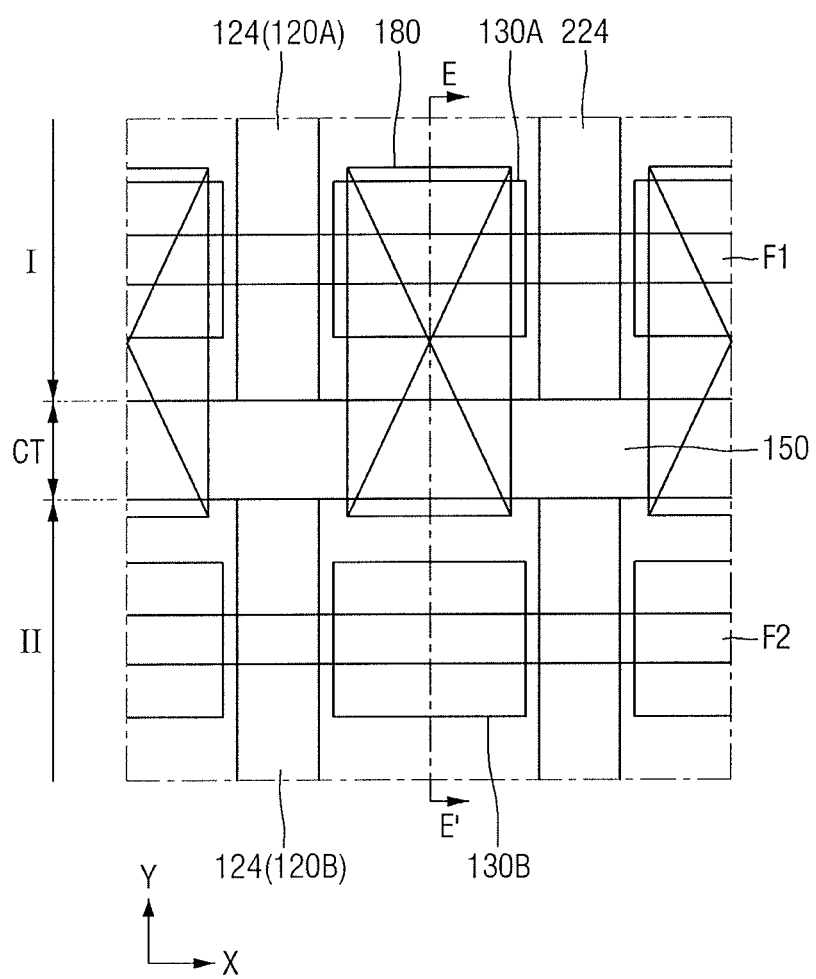
FIG. 7 illustrates a layout diagram of a semiconductor device according to some embodiments.
Figure 8:
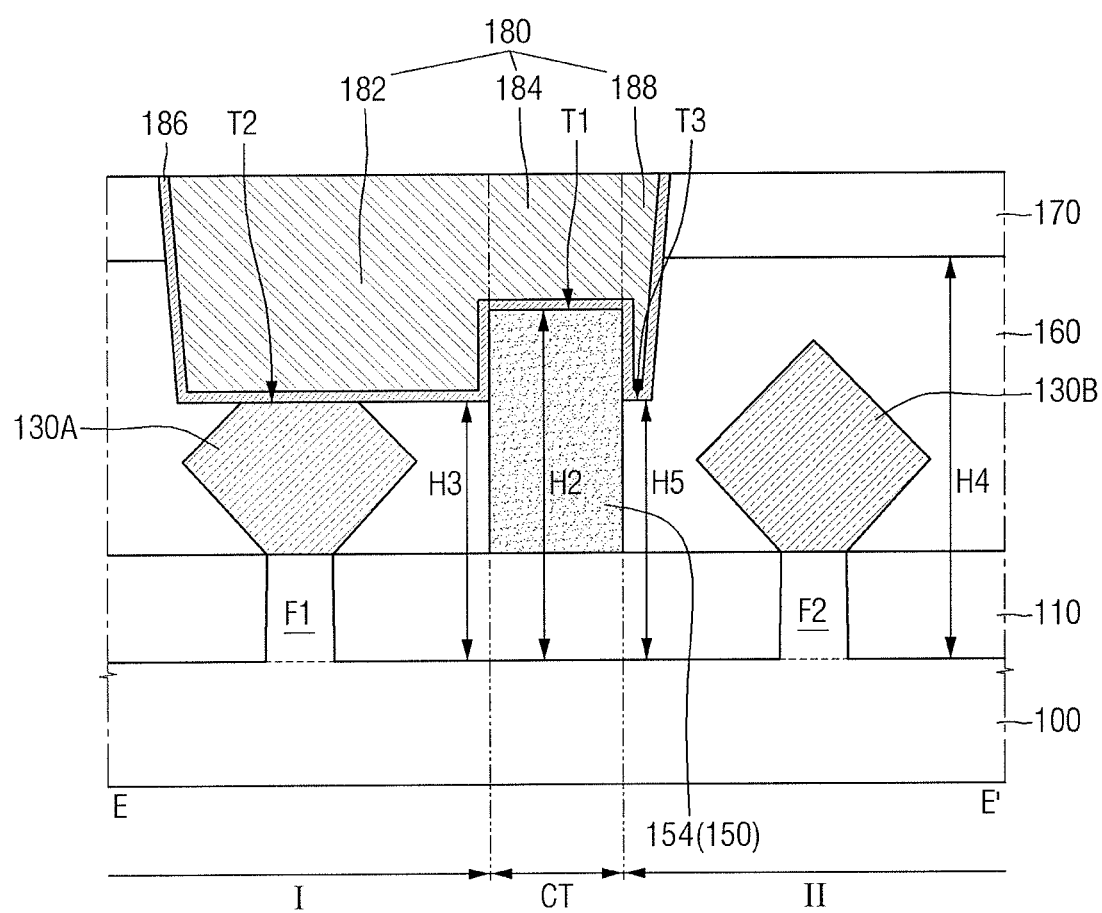
FIG. 8 illustrates a cross-sectional view taken along the line E-E' of FIG. 7.

FIG. 7 is a layout diagram of the semiconductor device according to some embodiments. FIG. 8 is a cross-sectional view taken along the line E-E' of FIG. 7. For the sake of convenience of explanation, repeated parts of those described with reference to FIGS. 1 to 5 will be only briefly described or omitted.

Referring to FIGS. 7 and 8, in the semiconductor device according to some embodiments, the contact 180 is formed over the first region I, the separation region CT, and the second region II. For example, the contact 180 may further include a third part 188 which fills a third trench T3 of the interlayer insulating layer 160. The third trench T3 may be formed by etching a part of the interlayer insulating layer 160 in the second region II. Further, the third trench T3 may be connected to the first trench T1.

A lower surface of the third trench T3 may be lower than the lower surface of the first trench T1. For example, a fifth height H5 of the lower surface of the third trench T3 may be lower than the second height H2 of the lower surface of the first trench T1. This allows the depth of the third part 188 to be greater than the depth of the second part 184. In some embodiments, the fifth height H5 of the lower surface of the third trench T3 may be substantially the same as the third height H3 of the lower surface of the second trench T2.

Figure 9:
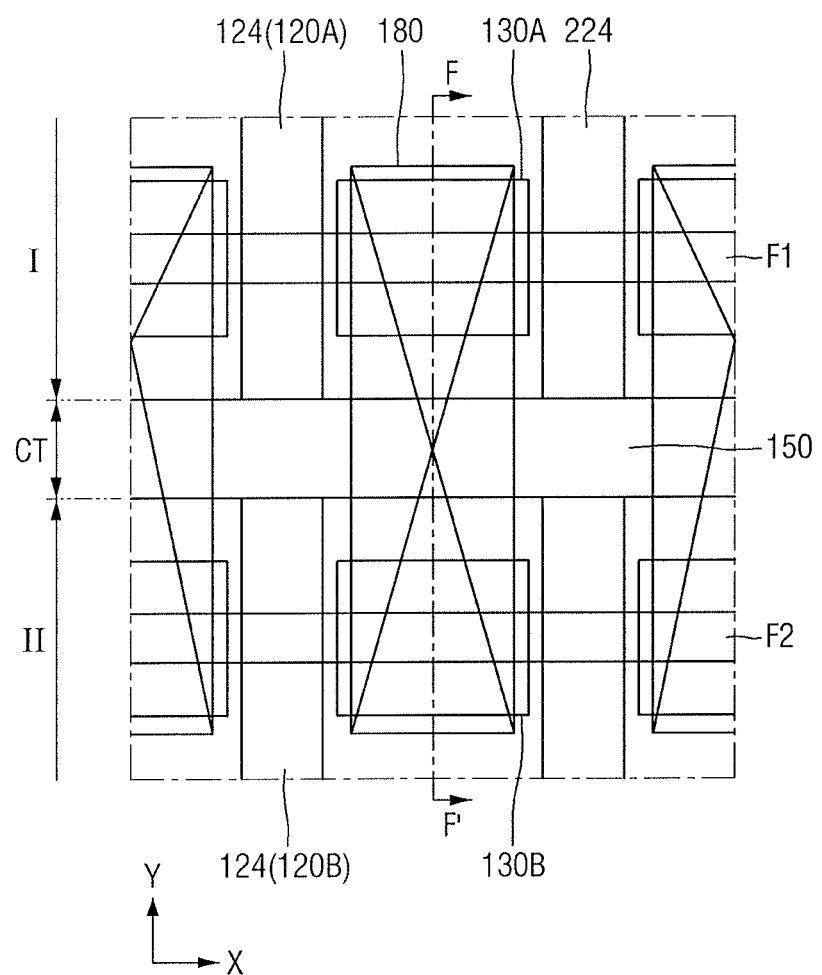
FIG. 9 illustrates a layout diagram of a semiconductor device according to some embodiments.
Figure 10:
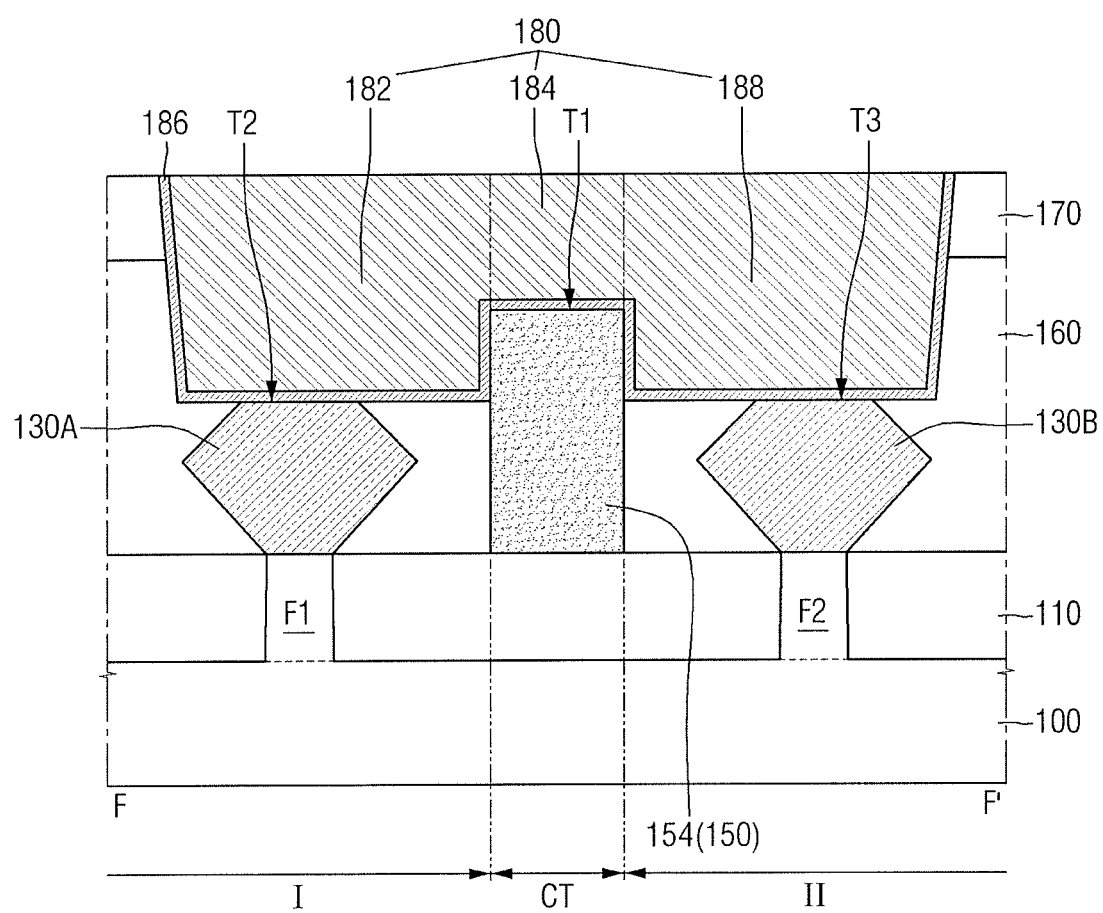
FIG. 10 illustrates a cross-sectional view taken along line F-F' of FIG. 9.

FIG. 9 is a layout diagram of a semiconductor device according to some embodiments. FIG. 10 is a cross-sectional view taken along line F-F' of FIG. 9. For the sake of convenience of explanation, repeated parts of those described with reference to FIGS. 1 to 5, 8, and 9 will be only briefly explained or omitted.

Referring to FIGS. 9 and 10, in a semiconductor device according to some embodiments, the contact 180 may be connected to the first source/drain region 130A and the second source/drain region 130B. For example, a third part 188 of the contact 180 penetrates the hard mask layer 170 and the interlayer insulating layer 160 on the second region II and may be connected to the second source/drain region 130B. Since the first part 182, the second part 184, and the third part 188 may be connected to each other, the contact 180 may be a shared contact common to the first source/drain region 130A and the second source/drain region 130B.

In some embodiments, the third trench T3 may be formed by etching a part of the upper part of the second source/drain region 130B. The upper surface of the second source/drain region 130B exposed by the third trench T3 is illustrated as being disposed on the same plane as the upper surface of the interlayer insulating layer 160 exposed by the third trench T3, but the present disclosure is not limited thereto. For example, the upper surface of the second source/drain region 130B exposed by the third trench T3 may be higher or lower than the upper surface of the interlayer insulating layer 160 exposed by the third trench T3, in accordance with the characteristics of the etching process of forming the third trench T3.

Further, the upper surface of the second source/drain region 130B exposed by the third trench T3 is illustrated as being disposed on the same plane as the upper surface of the first source/drain region 130A exposed by the second trench T2, but the present disclosure is not limited thereto. For example, the upper surface of the second source/drain region 130B exposed by the third trench T3 may be higher or lower than the upper surface of the first source/drain region 130A exposed by the second trench T2.

Figure 11:
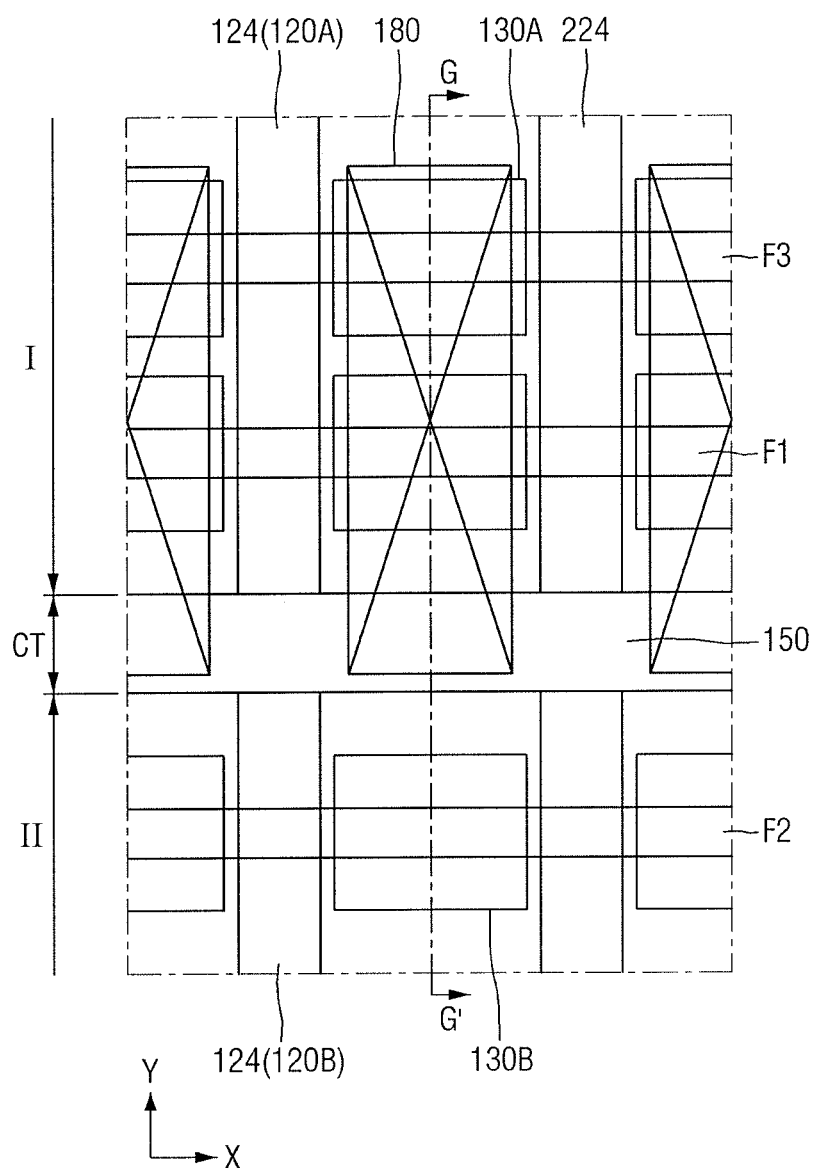
FIG. 11 illustrates a layout diagram of a semiconductor device according to some embodiments.
Figure 12:
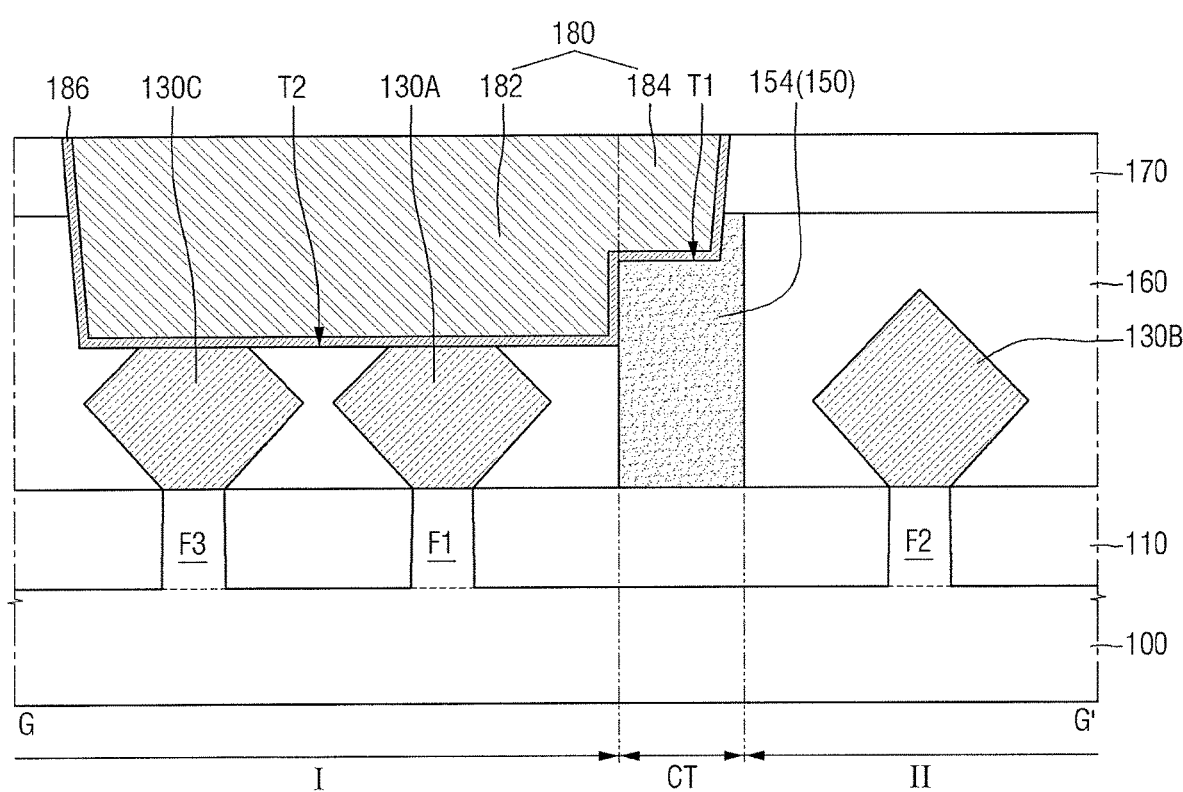
FIG. 12 illustrates a cross-sectional view taken along line G-G' of FIG. 11.

FIG. 11 is a layout diagram of a semiconductor device according to some embodiments. FIG. 12 is a cross-sectional view taken along line G-G' of FIG. 11. For the sake of convenience of explanation, repeated parts of those described with reference to FIGS. 1 to 5 will be only briefly described or omitted.

Referring to FIGS. 11 and 12, the semiconductor device according to some embodiments further includes a third fin type pattern F3 and a third source/drain region 130C.

The third fin type pattern F3 may be formed on the first region I of the substrate 100. Further, the third fin type pattern F3 may extend to be spaced apart from the first fin type pattern F1 and the second fin type pattern F2. For example, the third fin type pattern F3 may be spaced apart from the second fin type pattern F2 across the first fin type pattern F1 to extend in the first direction X.

The third source/drain region 130C may be formed in the third fin type pattern F3 on both sides of the first gate electrode 124. However, the third source/drain region 130C may be insulated from the first gate electrode 124 by the first gate spacer 126. As a result, the third source/drain region 130C may function as a source/drain of a transistor including the third fin type pattern F3 and the first gate electrode 124.

In some embodiments, the contact 180 may be connected to the first source/drain region 130A and the third source/drain region 130C. For example, the first part 182 of the contact 180 penetrates the hard mask layer 170 on the first region I and the interlayer insulating layer 160, and may be connected to the first source/drain region 130A and the third source/drain region 130C. In other words, the contact 180 may be a shared contact common to the first source/drain region 130A and the third source/drain region 130C.

The upper surface of the third source/drain region 130C exposed by the second trench T2 is illustrated as being disposed on the same plane as the upper surface of the first source/drain region 130A exposed by the second trench T2, but the present disclosure is not limited thereto. For example, the upper surface of the third source/drain region 130C exposed by the second trench T2 may be higher or lower than the upper surface of the first source/drain region 130A exposed by the second trench T2.

Hereinafter, the semiconductor devices according to some embodiments will be described with reference to FIGS. 1 to 5 and FIGS. 13 to 38. FIGS. 13 to 38 are intermediate step diagrams for explaining a method for fabricating a semiconductor device according to some embodiments. For the sake of convenience of explanation, repeated parts of those described with reference to FIGS. 1 to 5 will be only briefly described or omitted.

Figure 13:
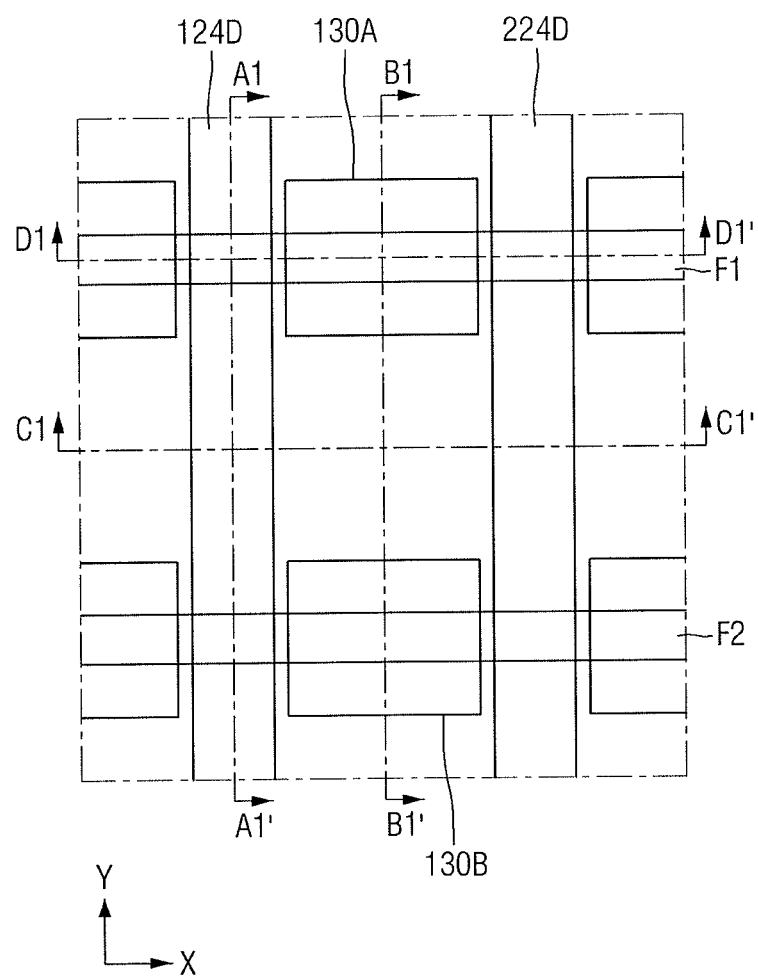
FIGS. 13 to 38 illustrate cross-sectional views of stages in a method for fabricating a semiconductor device according to some embodiments.
Figure 14:
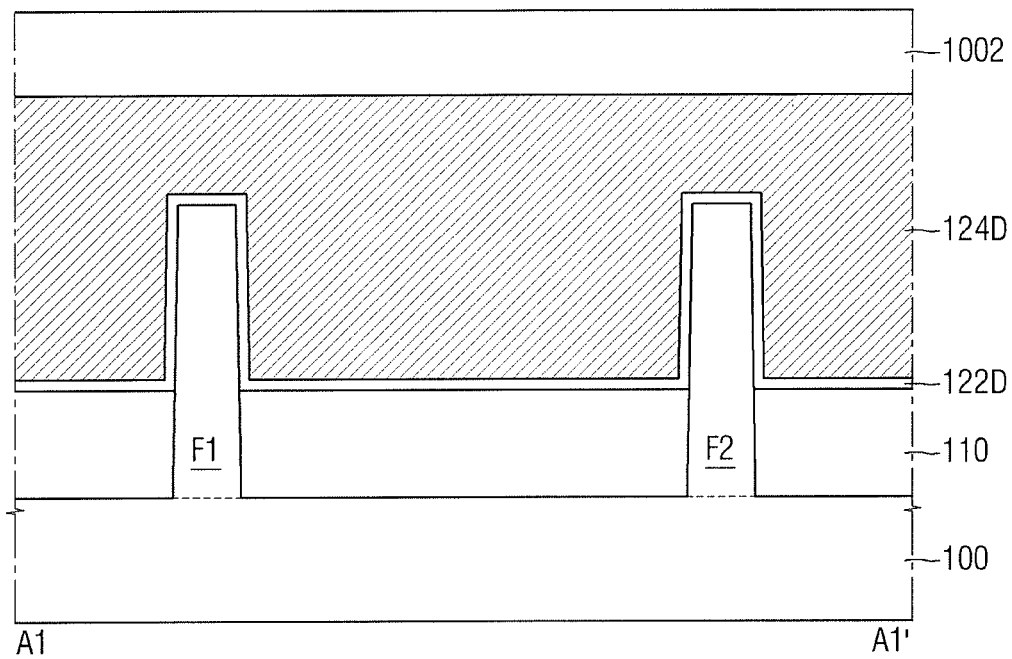
Figure 15:
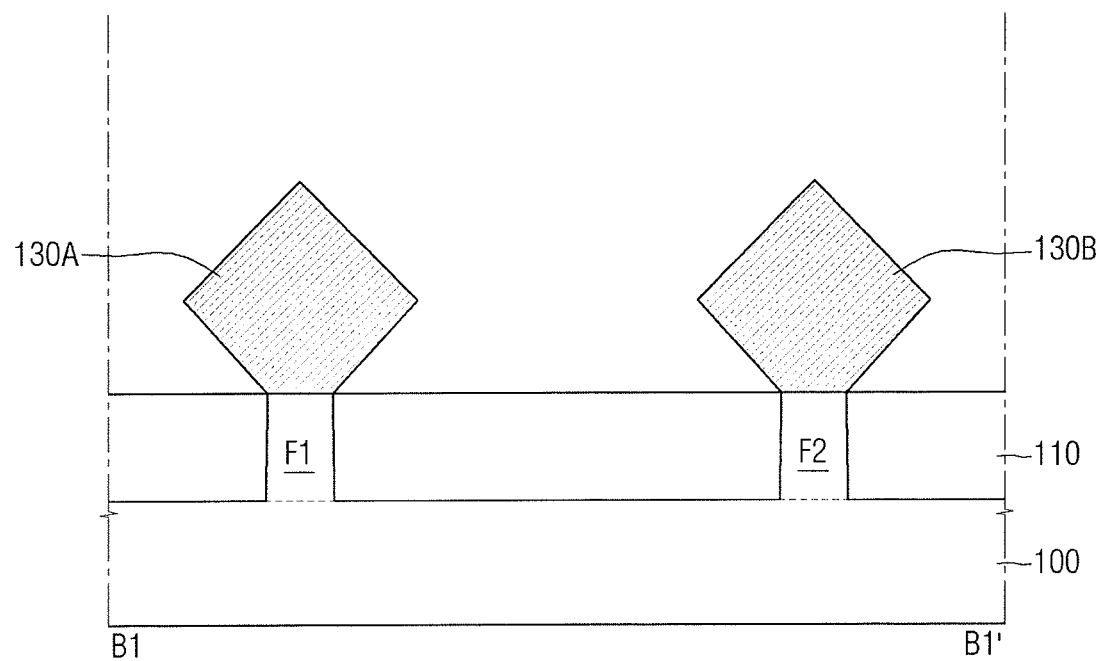
Figure 16:
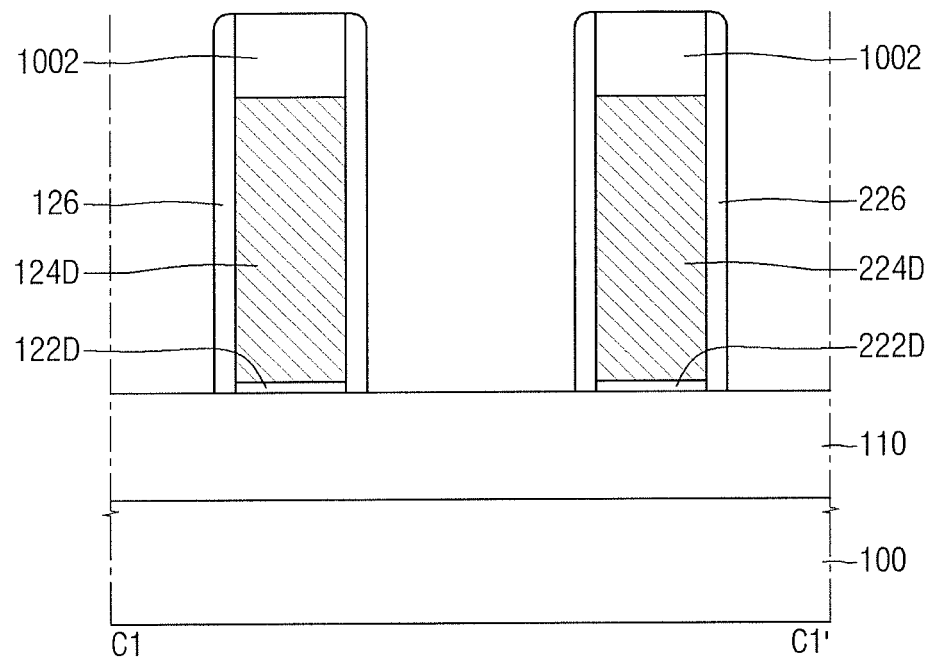
Figure 17:
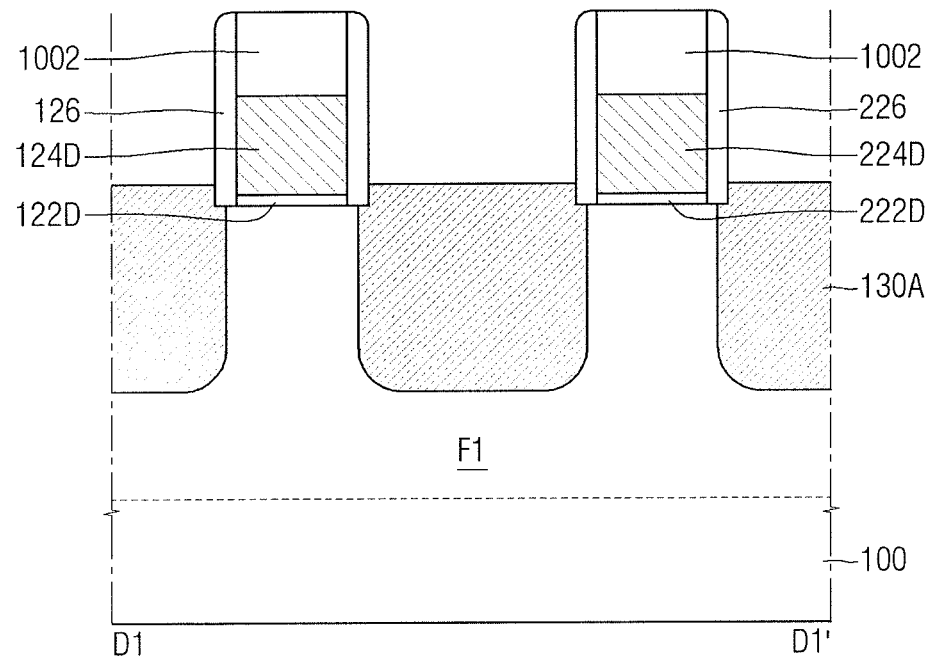

FIG. 13 is a layout diagram in a manufacturing stage of a semiconductor device according to some embodiments. FIG. 14 is a cross-sectional view along line A1-A1' of FIG. 13. FIG. 15 is a cross-sectional view along line B1-B1' of FIG. 13. FIG. 16 is a cross-sectional view along line C1-C1' of FIG. 13. FIG. 17 is a cross-sectional view along line D-D1' of FIG. 13.

Referring to FIGS. 13 to 17, a first dummy gate dielectric layer 122D, a first dummy gate electrode 124D, a second dummy gate dielectric layer 222D, a second dummy gate electrode 224D, the first gate spacer 126, the second gate spacer 226, the first source/drain region 130A, and the second source/drain region 130B are formed on the substrate 100.

First, the substrate 100 including the first fin type pattern F1 and the second fin type pattern F2 may be provided. Each of the first fin type pattern F1 and the second fin type pattern F2 may protrude from the substrate 100 and extend in the first direction X. The first fin type pattern F1 and the second fin type pattern F2 may be parts of the substrate 100, and may include an epitaxial layer grown from the substrate 100.

Subsequently, the field insulating layer 110 may be formed on the substrate 100. The field insulating layer 110 may cover a part of the side wall of the first fin type pattern F1 and a part of the side wall of the second fin type pattern F2.

Subsequently, the first dummy gate dielectric layer 122D, the first dummy gate electrode 124D, the second dummy gate dielectric layer 222D, and the second gate electrode 224 may be formed on the substrate 100.

For example, an insulating layer and a conductive layer may be sequentially formed on the substrate 100 and the field insulating layer 110, and the insulating layer and the conductive layer may be patterned, using a plurality of dummy capping patterns 1002 extending in the second direction Y. Thus, the first dummy gate electrode 124D and the second dummy gate electrode 224D spaced apart from each other and extending in the second direction Y may be formed on the substrate 100 and the field insulating layer 110.

Subsequently, the first source/drain region 130A in the first fin type pattern F1 and the second source/drain region 130B in the second fin type pattern F2 may be formed. For example, the first gate spacer 126 may be formed on the side wall of the first dummy gate electrode 124D, and the second gate spacer 226 may be formed on the side wall of the second dummy gate electrode 224D. Subsequently, a part of the first fin type pattern F1 and a part of the second fin type pattern F2 may be etched, using an etching process for using the first dummy gate electrode 124D, the first gate spacer 126, the second dummy gate electrode 224D, and the second gate spacer 226 as etching masks. Subsequently, the first source/drain region 130A may be formed in the etched first fin type pattern F1, and the second source/drain region 130B may be formed in the etched second fin type pattern F2, using an epitaxial growth method.

Figure 18:
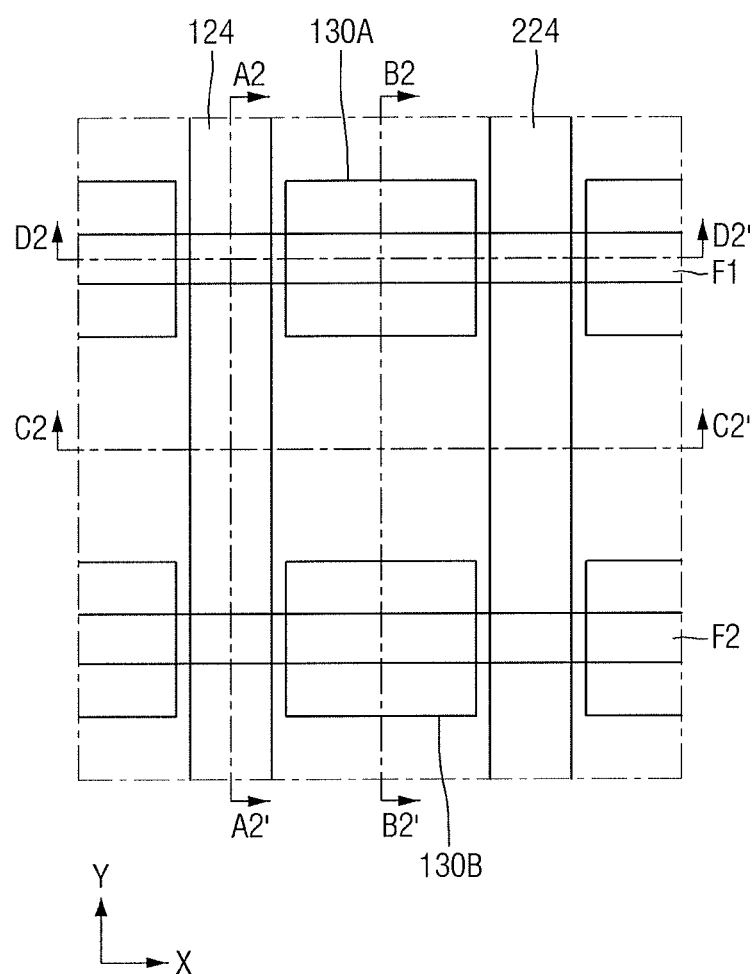
Figure 19:
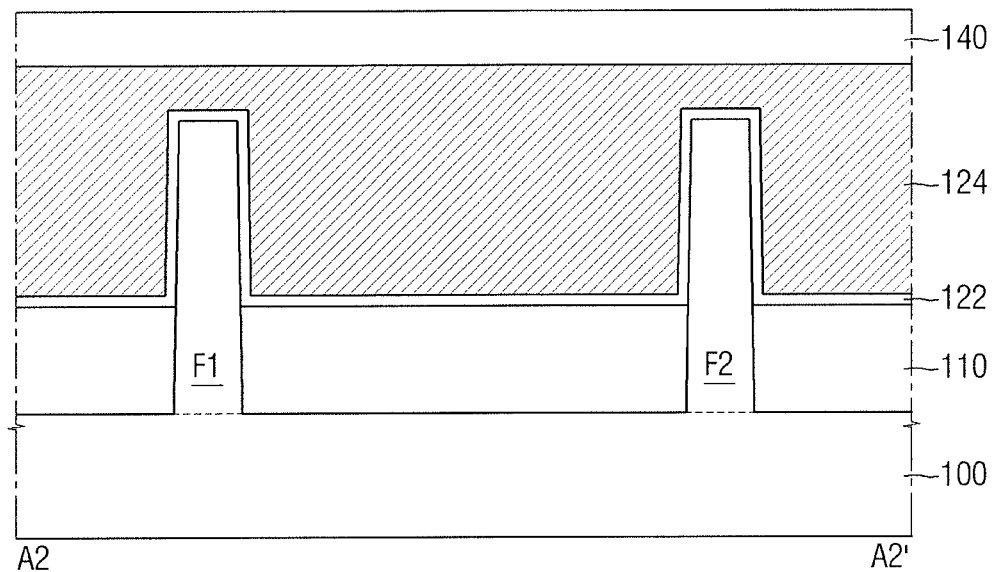
Figure 20:
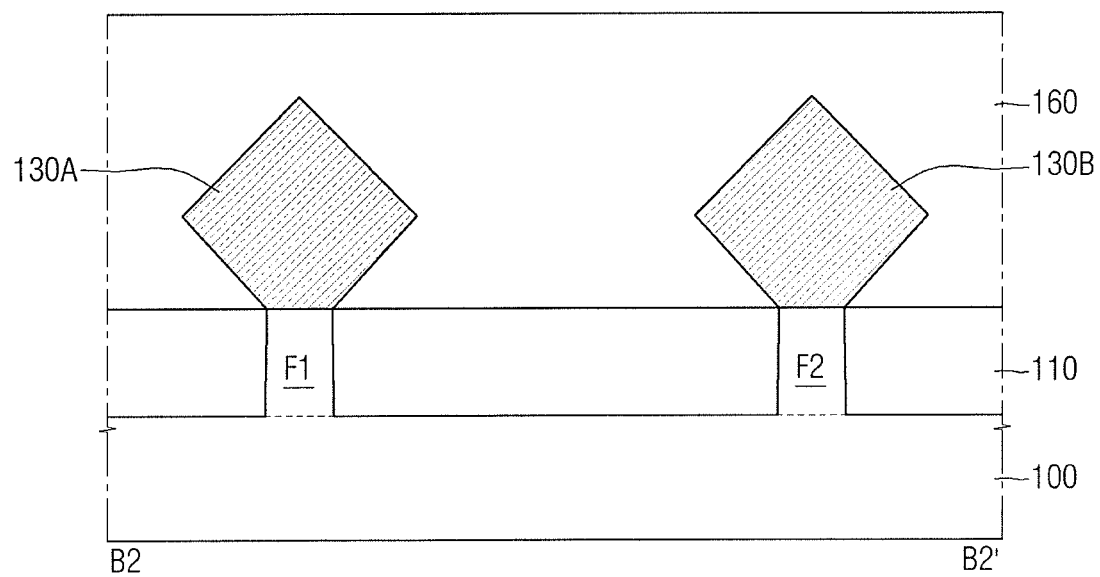
Figure 21:
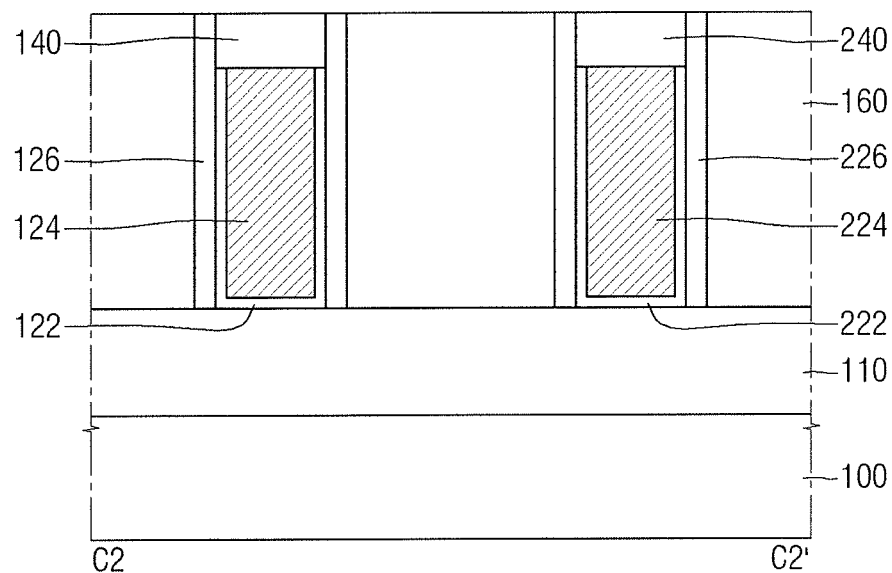
Figure 22:
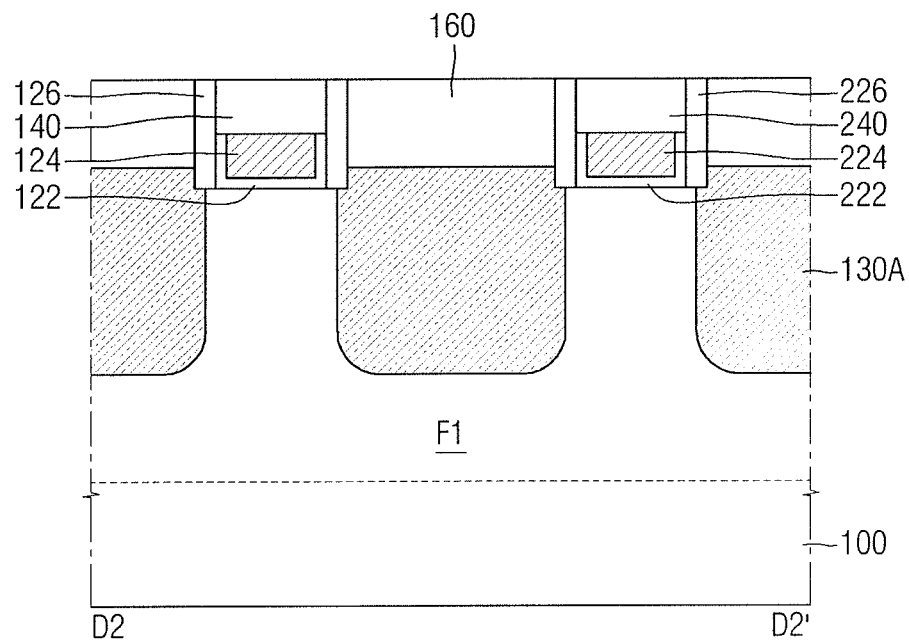

The next stage will be explained with reference to FIGS. 18 to 22. FIG. 18 is a layout diagram in a manufacturing stage of a semiconductor device according to some embodiments. FIG. 19 is a cross-sectional view along line A2-A2' of FIG. 18. FIG. 20 is a cross-sectional view along line B2-B2' of FIG. 18. FIG. 21 is a cross-sectional view along line C2-C2' of FIG. 18. FIG. 22 is a cross-sectional view along line D2-D2' of FIG. 18.

Referring to FIGS. 18 to 22, the first dummy gate electrode 124D is replaced with the first gate electrode 124, and the second dummy gate electrode 224D is replaced with the second gate electrode 224.

First, the interlayer insulating layer 160 may be formed on the substrate 100 and the field insulating layer 110. The interlayer insulating layer 160 may be formed to fill a peripheral space. For example, the interlayer insulating layer 160 may cover the first source/drain region 130A and the second source/drain region 130B.

Subsequently, the first dummy gate dielectric layer 122D, the first dummy gate electrode 124D, the second dummy gate dielectric layer 222D, and the second dummy gate electrode 224D may be removed. For example, after performing the planarization process until the upper surface of the first dummy gate electrode 124D and the upper surface of the second dummy gate electrode 224D are exposed, the first dummy gate dielectric layer 122D, the first dummy gate electrode 124D, the second dummy gate dielectric layer 222D, and the second dummy gate electrode 224D may be removed.

Subsequently, the first gate dielectric layer 122 and the first gate electrode 124 may be formed sequentially in the region from which the first dummy gate dielectric layer 122D and the first dummy gate electrode 124D are removed. Further, the second gate dielectric layer 222 and the second gate electrode 224 may be formed sequentially in the region from which the second dummy gate dielectric layer 222D and the second dummy gate electrode 224D are removed.

In some embodiments, the method may further include formation of the first capping pattern 140 and the second capping pattern 240. For example, the upper part of the first gate electrode 124 and the upper part of the second gate electrode 224 may be recessed until they become lower than the upper surface of the interlayer insulating layer 160. Subsequently, the first capping pattern 140 may be formed on the recessed first gate electrode 124, and the second capping pattern 240 may be formed on the recessed second gate electrode 224.

Figure 23:
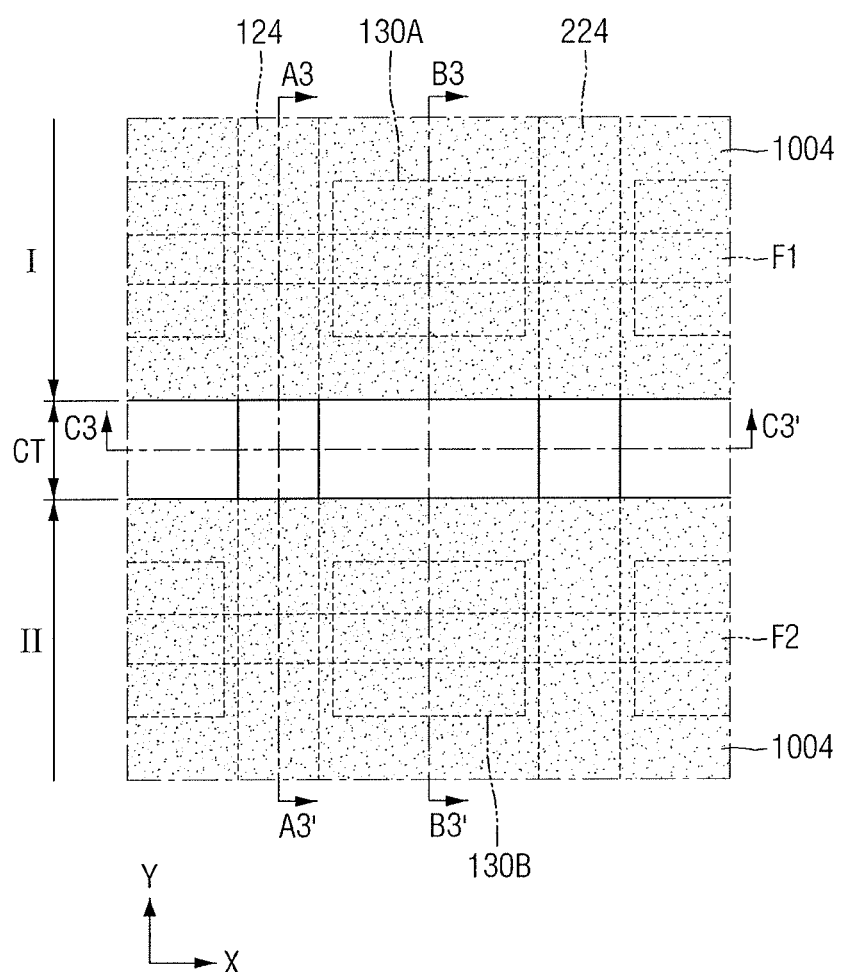
Figure 24:
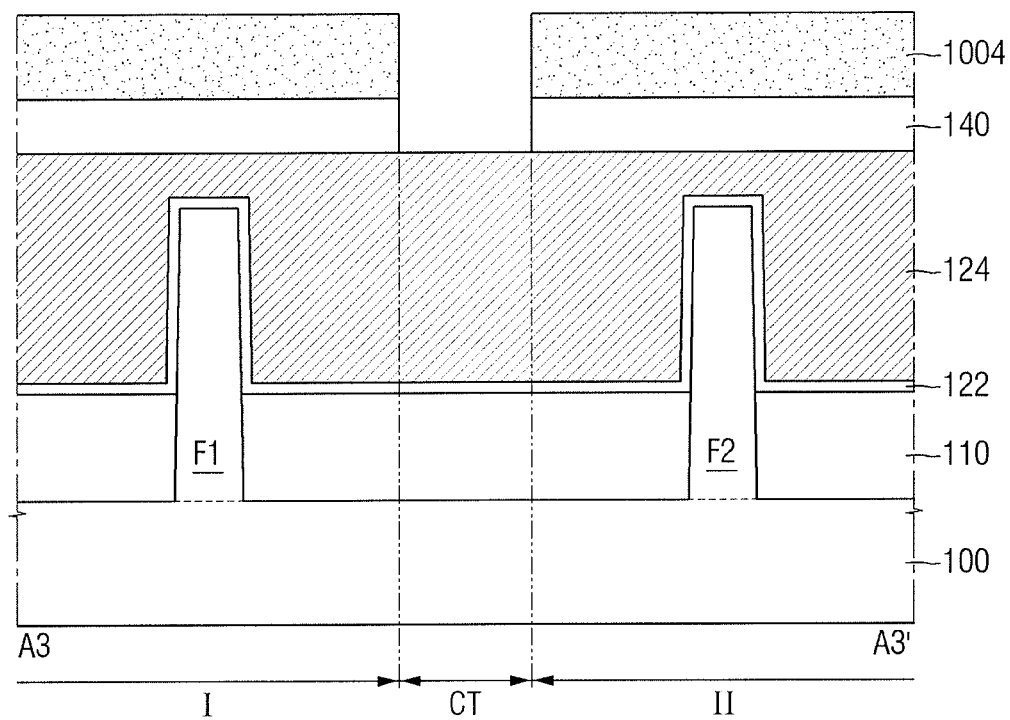
Figure 25:
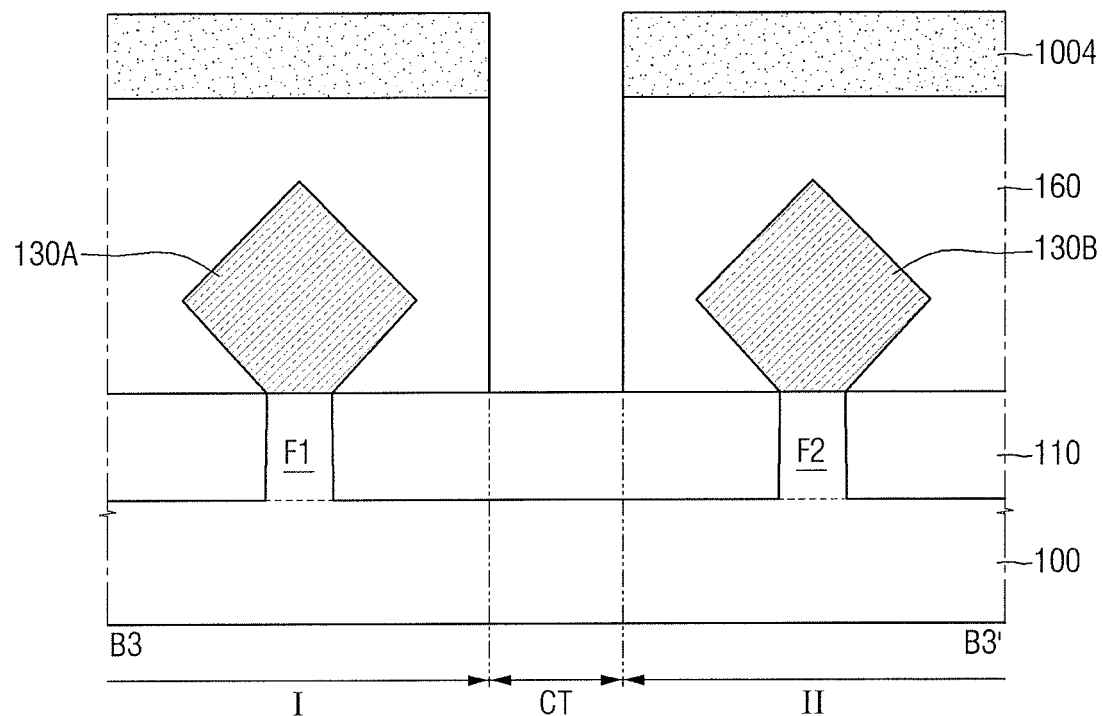
Figure 26:
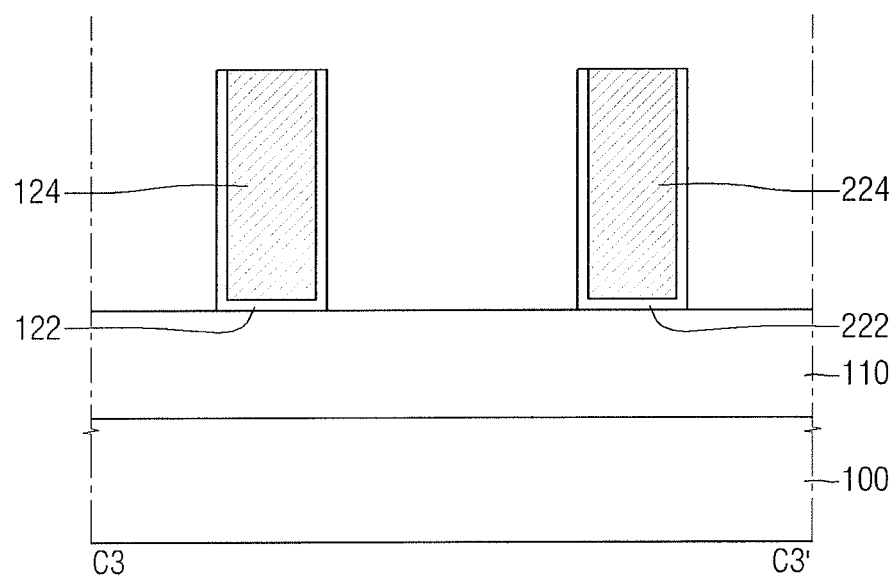
Figure 27:
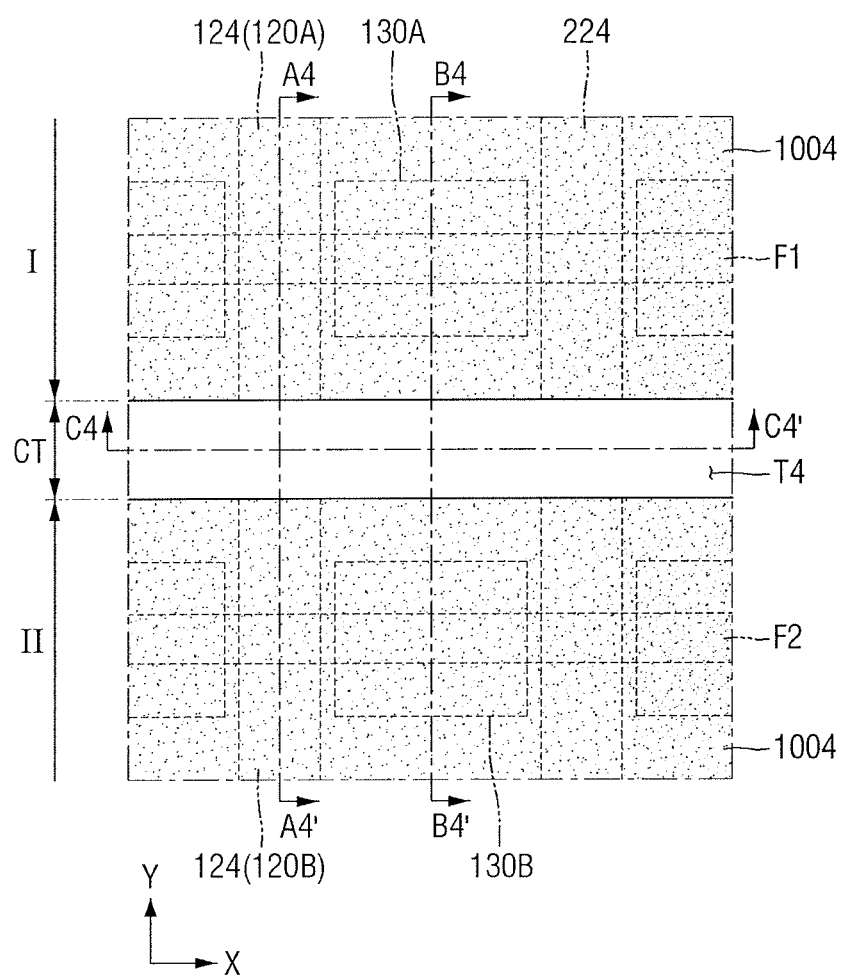

The next stage will be explained with reference to FIGS. 23 to 26. FIG. 23 is a layout diagram in a manufacturing stage of a semiconductor device according to some embodiments. FIG. 24 is a cross-sectional view along line A3-A3' of FIG. 23. FIG. 25 is a cross-sectional view along line B3-B3' of FIG. 23. FIG. 26 is a cross-sectional view along line C3-C3' of FIG. 23. FIG. 27 is a cross-sectional view along line D3-D3' of FIG. 23.

Referring to FIGS. 23 to 26, the first gate electrode 124 and the second gate electrode 224 on the separation region CT are exposed. For example, a mask pattern 1004 which covers the first region I and the second region II and exposes the separation region CT may be formed. As a result, the first capping pattern 140 and the second capping pattern 240 on the separation region CT may be exposed.

The mask pattern 1004 may be formed by, e.g., a photolithography process, but it is not limited thereto. The mask pattern 1004 may include, for example, silicon nitride.

Subsequently, the first capping pattern 140 and the second capping pattern 240 may be etched, using the mask pattern 1004 as an etching mask. As a result, the first gate electrode 124 and the second gate electrode 224 on the separation region CT may be exposed.

In some embodiments, the interlayer insulating layer 160 may be etched together with the first capping pattern 140 and the second capping pattern 240. Therefore, as illustrated in FIG. 25, the field insulating layer 110 on the separation region CT may be exposed. However, the present disclosure is not limited thereto. For example, in some embodiments, only a part of the interlayer insulating layer 160 may be etched, and the field insulating layer 110 on the separation region CT may not be exposed. In another example, in some embodiments, the interlayer insulating layer 160 may not be etched.

In some embodiments, at least a part of the field insulating layer 110 may be etched together with the interlayer insulating layer 160. For example, a part of the field insulating layer 110 on the separation region CT may be etched. As a result, the upper surface of the field insulating layer 110 on the separation region CT may be formed to be lower than the upper surface of the field insulating layer 110 of the first region I and the second region II. In another example, the overall field insulating layer 110 on the separation region CT may be etched. Therefore, the substrate 100 on the separation region CT may be exposed.

In some embodiments, a part of the substrate 100 may be etched together with the interlayer insulating layer 160 and the field insulating layer 110. For example, a part of the substrate 100 on the separation region CT may be etched. As a result, the upper surface of the substrate 100 on the separation region CT may be formed to be lower than the upper surface of the substrate 100 of the first region I and the second region II.

Figure 28:
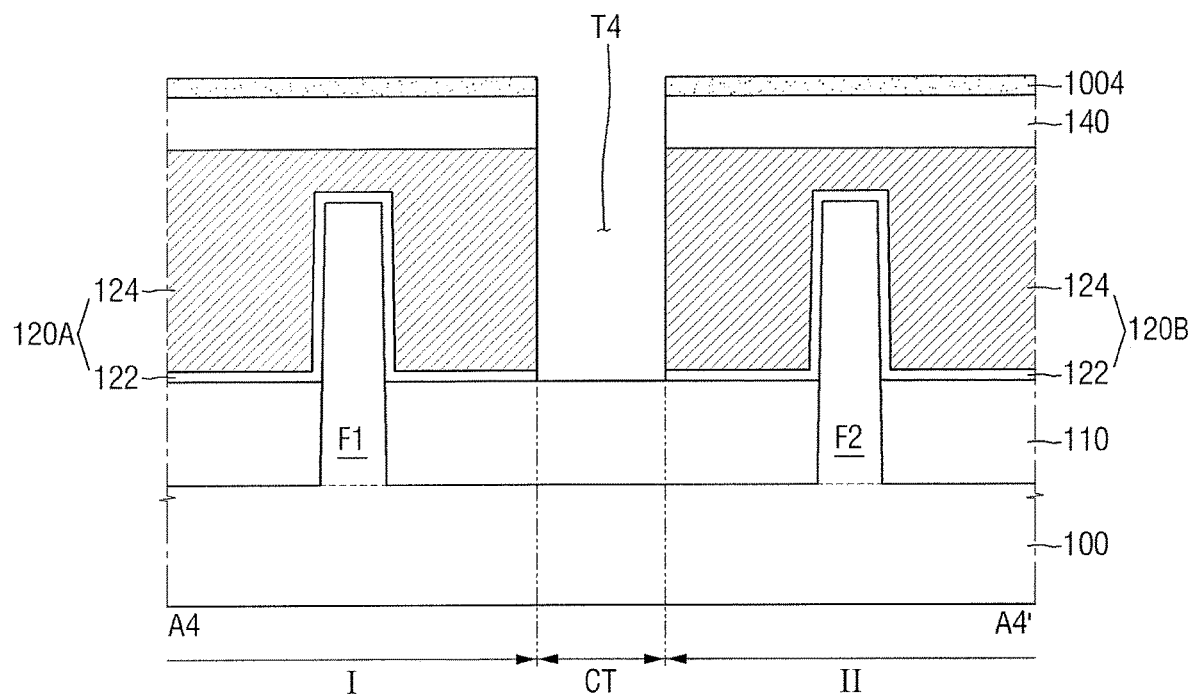
Figure 29:
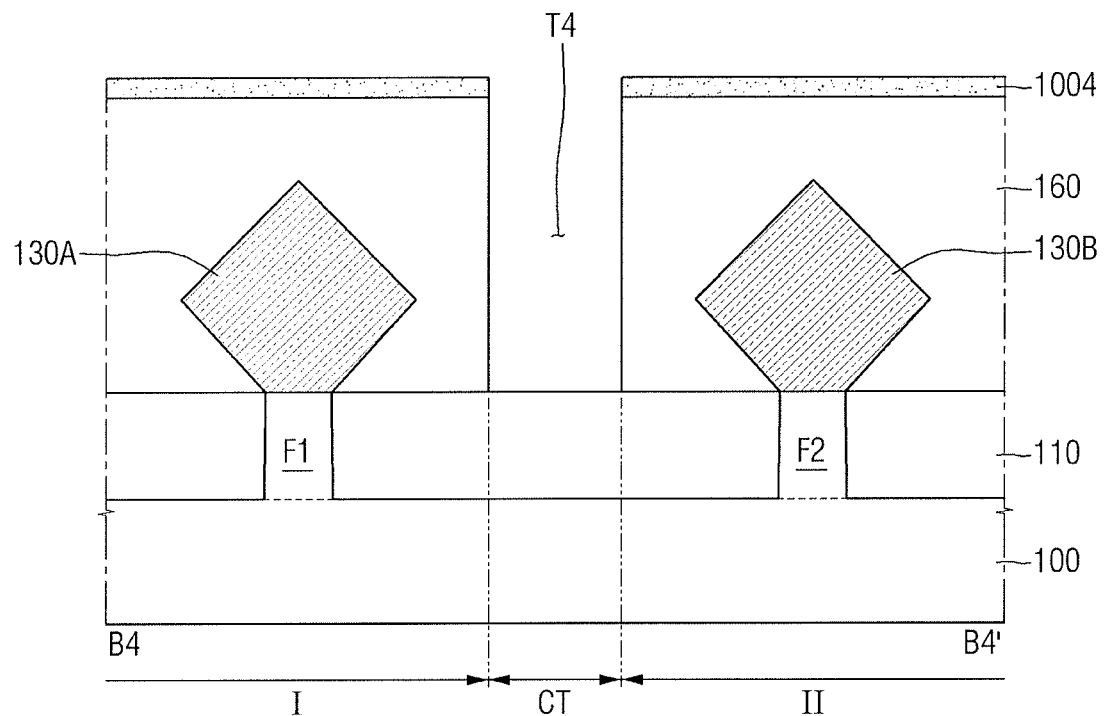
Figure 30:
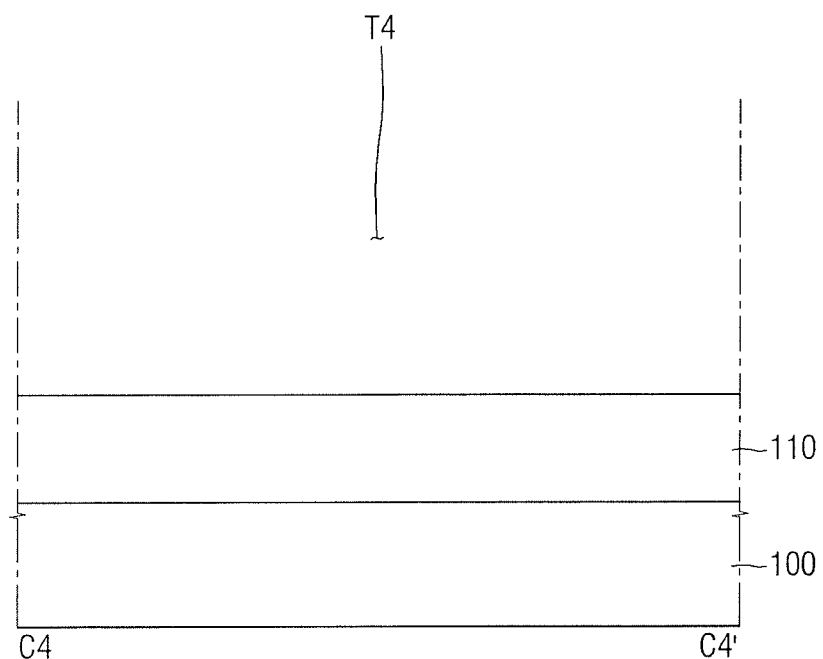

The next stage will be explained with reference to FIGS. 27 to 30. FIG. 27 is a layout diagram in a manufacturing stage of a semiconductor device according to some embodiments. FIG. 28 is a cross-sectional view along line A4-A4' of FIG. 27. FIG. 29 is a cross-sectional view along line B4-B4' of FIG. 27. FIG. 30 is a cross-sectional view along line C1-C4' of FIG. 27.

Referring to FIGS. 27 to 30, the first gate electrode 124, the first gate dielectric layer 122, the second gate electrode 224, and the second gate dielectric layer 222 are formed, using the mask pattern 1004 as an etching mask. Therefore, the first gate structure 120A may be formed on the first region I of the substrate 100, and the second gate structure 120B separated from the first gate structure 120A may be formed on the second region II of the substrate 100.

A fourth trench T4 extending in the second direction Y may be formed on the separation region CT. The lower surface of the fourth trench T4 may be defined by the upper surface of the field insulating layer 110 on the separation region CT. The side wall of the fourth trench T4 may be defined by the side wall of the first gate electrode 124, the side wall of the first capping pattern 140, the side wall of the second gate electrode 224, the side wall of the second capping pattern 240, and the side wall of the interlayer insulating layer 160.

In some embodiments, the interlayer insulating layer 160 may be etched together with the first gate electrode 124 and the second gate electrode 224. For example, in the processes according to FIGS. 23 to 26, the interlayer insulating layer 160 on the separation region CT may not be completely etched. In such a case, the interlayer insulating layer 160 on the separation region CT may be completely etched together with the first gate electrode 124 and the second gate electrode 224. As a result, the field insulating layer 110 on the separation region CT may be exposed.

Figure 31:
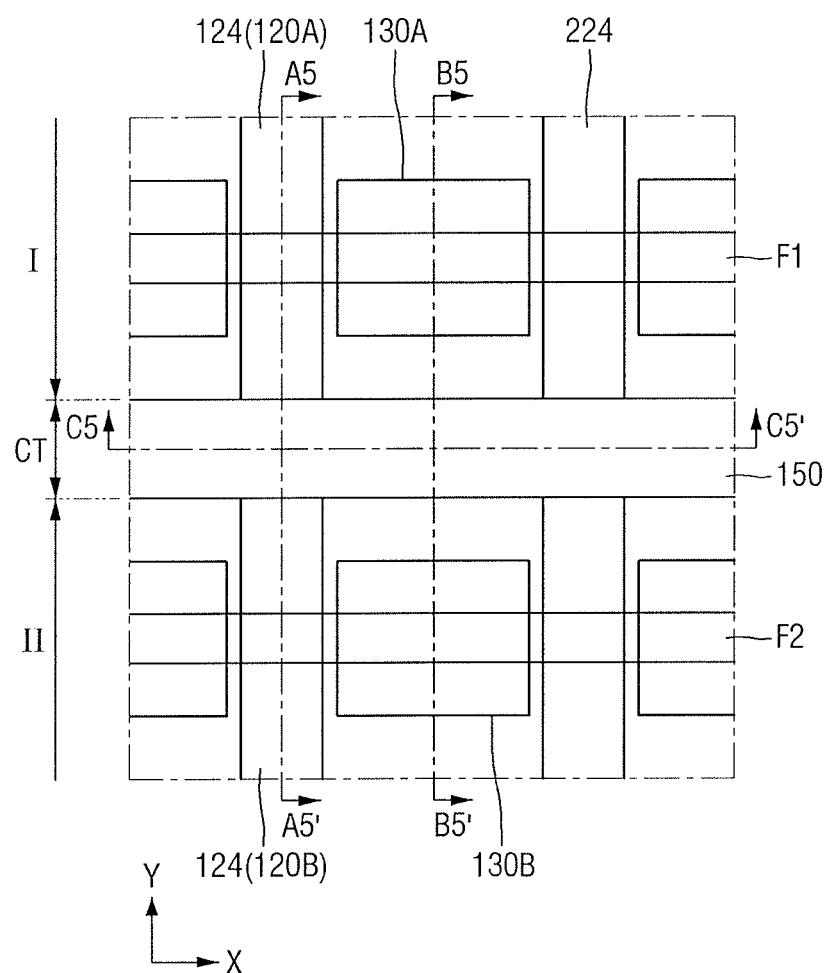
Figure 32:
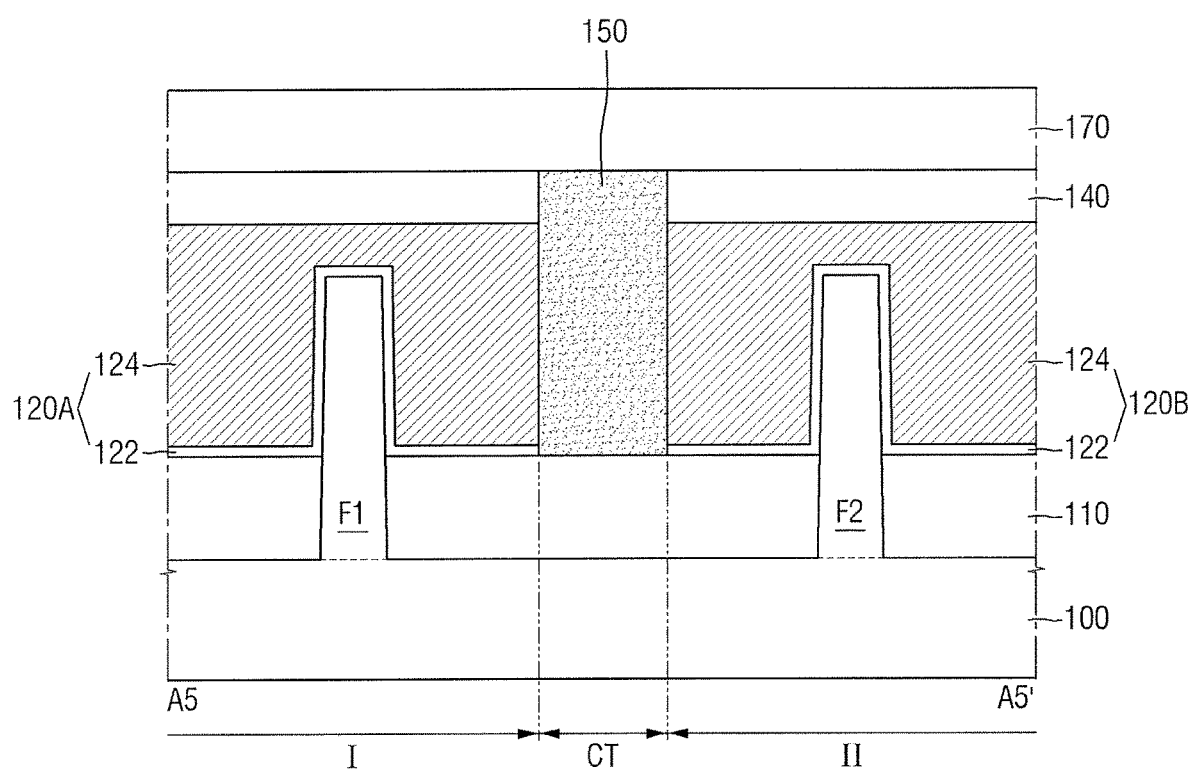
Figure 33:
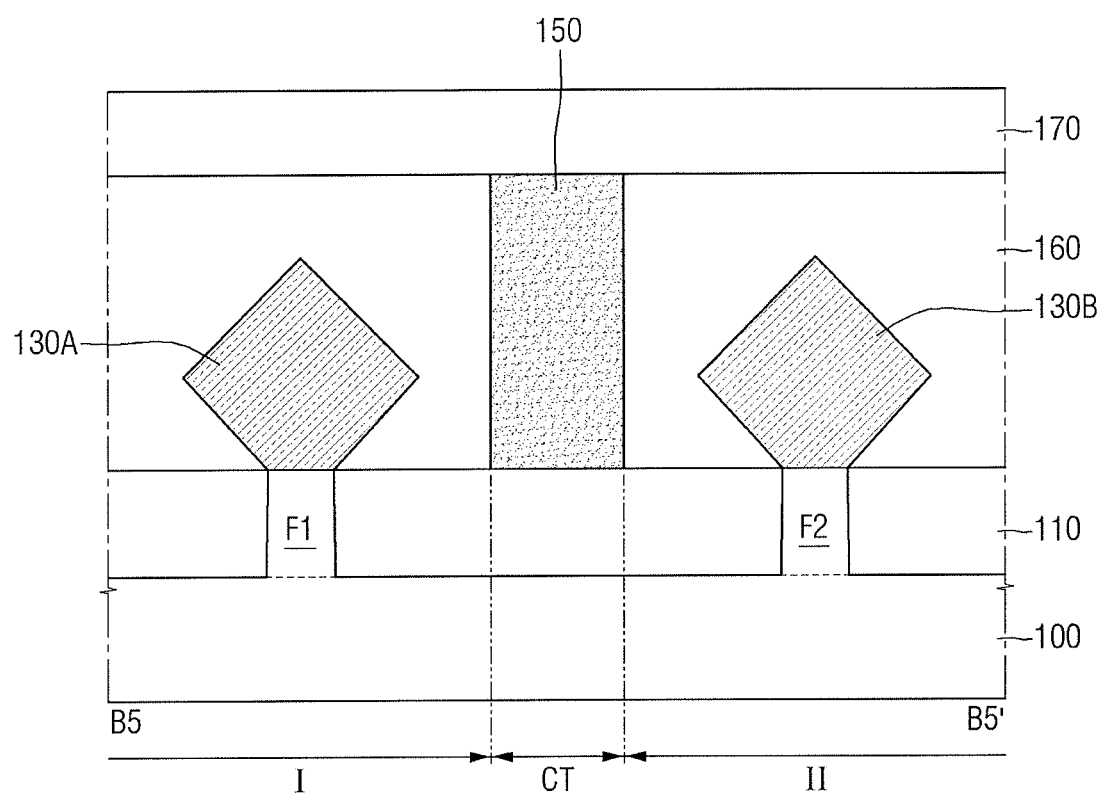
Figure 34:
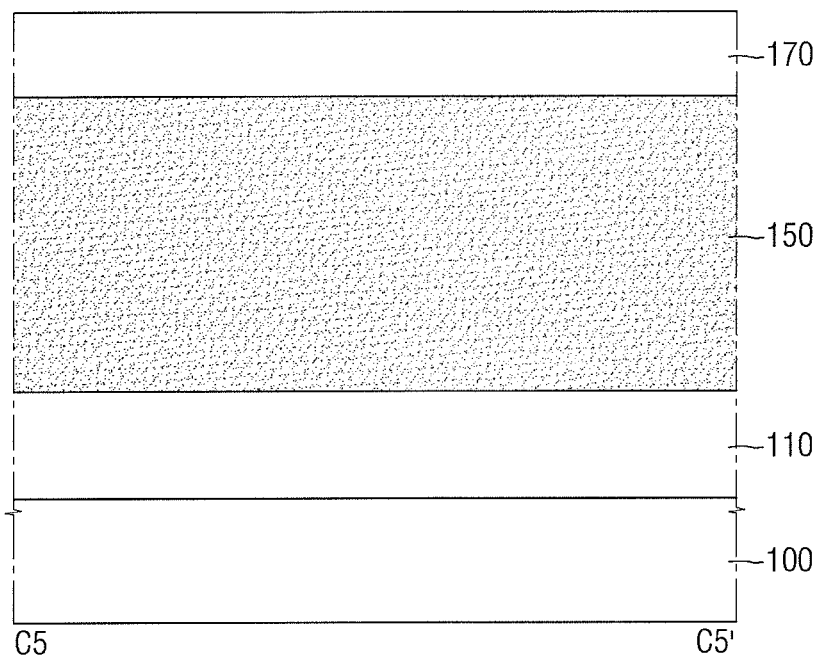

The next stage will be explained with reference to FIGS. 31 to 34. FIG. 31 is a layout diagram in a manufacturing stage of a semiconductor device according to some embodiments. FIG. 32 is a cross-sectional view along line A5-A5' of FIG. 31. FIG. 33 is a cross-sectional view along line B5-B5' of FIG. 31. FIG. 34 is a cross-sectional view along line C5-C5' of FIG. 31.

Referring to FIGS. 31 to 34, the separation structure 150 is formed on the separation region CT.

For example, a separation structure 150 for filling the fourth trench T4 may be formed. Subsequently, the planarization process may be performed until the upper surface of the first capping pattern 140, the upper surface of the second capping pattern 240, and the upper surface of the interlayer insulating layer 160 are exposed. As a result, the first gate electrode 124, the first capping pattern 140, the second gate electrode 224, the second capping pattern 240, and the interlayer insulating layer 160 may be physically separated by the separation structure 150.

The separation structure 150 may include an insulating material, e.g., the insulating material of the separation structure 150 may be different from that of the interlayer insulating layer 160 and have a lower etch rate than that of the interlayer insulating layer 160. For example, the separation structure 150 may include silicon nitride. Thus, the first gate electrode 124 and the second gate electrode 224 may be electrically separated from each other by the separation structure 150.

In some embodiments, the method may further include formation of the hard mask layer 170 after forming the separation structure 150. For example, the hard mask layer 170 may be formed on the interlayer insulating layer 160, the separation structure 150, the first capping pattern 140, and the second capping pattern 240. The hard mask layer 170 may include, e.g., but is not limited to, TEOS (tetraethyl orthosilicate).

Figure 35:
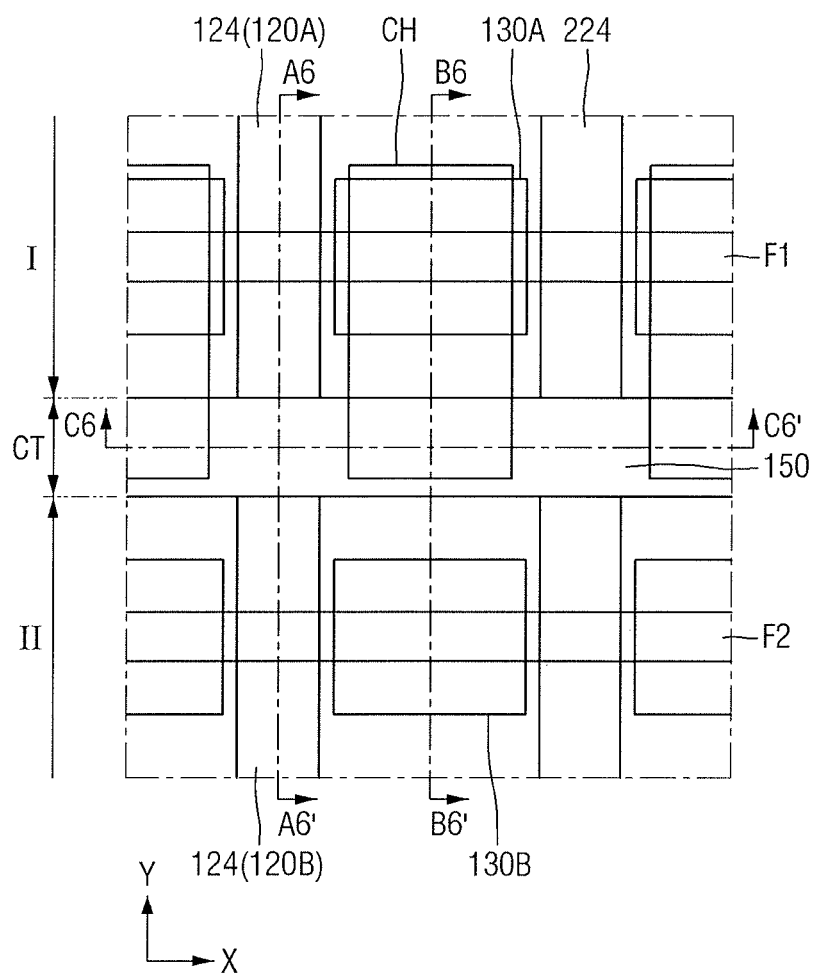
Figure 36:
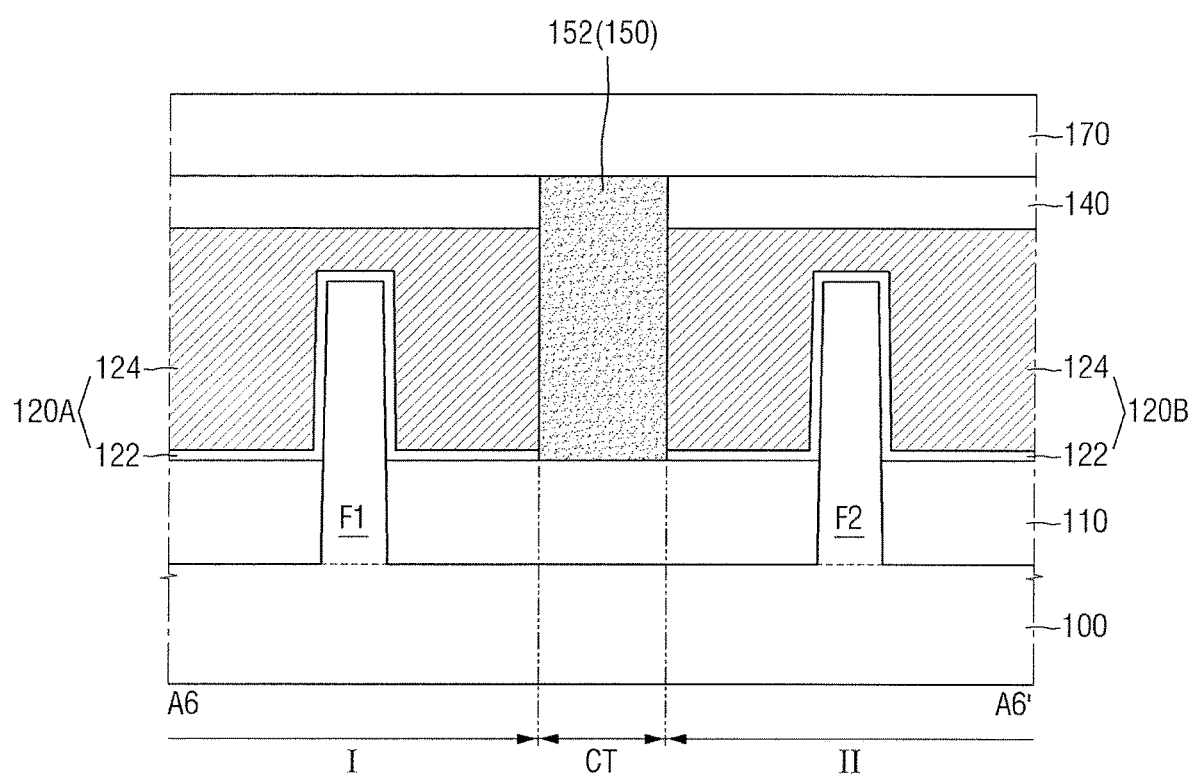
Figure 37:
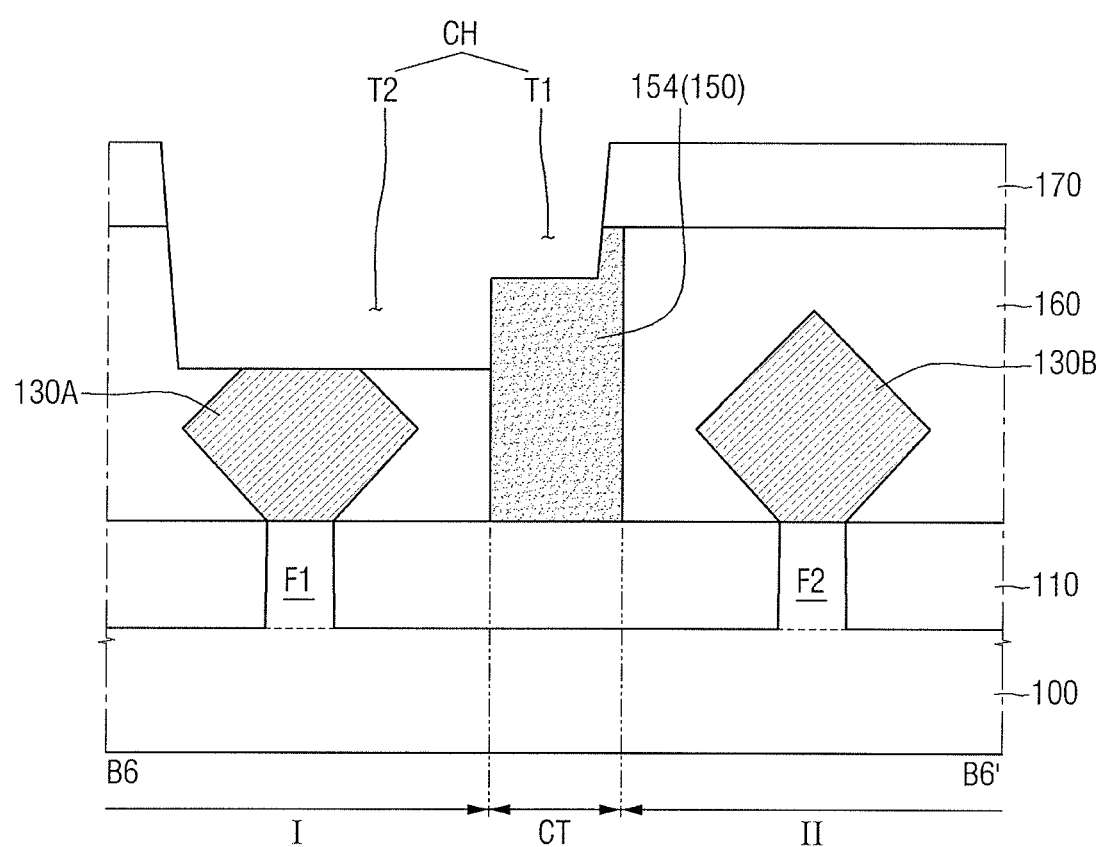
Figure 38:
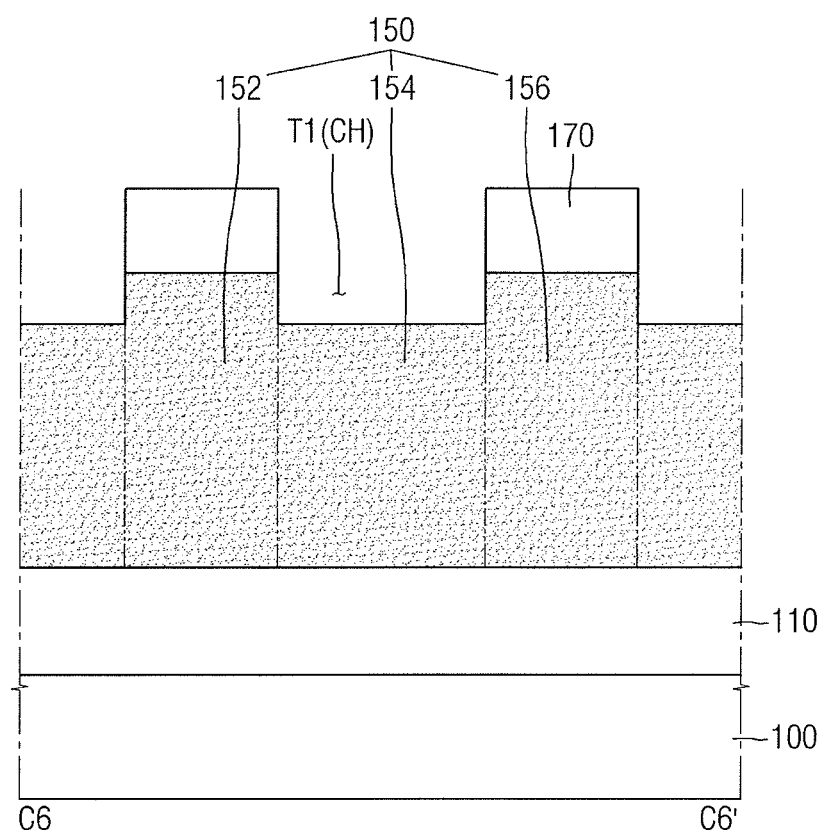

The next stage will be explained with reference to FIGS. 35 to 38. FIG. 35 is a layout diagram in a manufacturing stage of a semiconductor device according to some embodiments. FIG. 36 is a cross-sectional view along line A6-A6' of FIG. 35. FIG. 37 is a cross-sectional view along line B6-B6' of FIG. 35. FIG. 38 is a cross-sectional view along line C6-C6' of FIG. 35.

Referring to FIGS. 35 to 38, a contact hole CH for exposing the first source/drain region 130A is formed. The contact hole CH may be formed over the first region I and the separation region CT. For example, the contact hole CH may include the first trench T1 in the separation structure 150, and the second trench T2 in the interlayer insulating layer 160 on the first region I. For example, as illustrated in FIG. 37, the first and second trenches T1 and T2 may be connected to each other and in fluid communication with each other.

The contact hole CH may be formed by an etching process having a larger etching rate with respect to the interlayer insulating layer 160 than the separation structure 150. That is, as discussed previously, the etching process may be adjusted to have the interlayer insulating layer 160 etched faster than the separation structure 150, e.g., so more material may be removed from the interlayer insulating layer 160 than from the separation structure 150, to form the second trench T2 in the interlayer insulating layer 160 deeper than the first trench T1 in the separation structure 150. As a result, as illustrated in FIG. 37, the lower surface of the first trench T1 may be formed to be higher than the lower surface of the second trench T2.

Further, as illustrated in FIG. 38, the separation structure 150 having an upper surface of an irregular shape may be formed. For example, the separation structure 150 may include the first separation part 152, the connection part 154, and the second separation part 156. In some embodiments, the height of the connection part 154 may be lower than the height of the first separation part 152 and the height of the second separation part 156.

Accordingly, as illustrated in FIG. 3, the contact 180 may be formed to have the second part 184 of the contact 180 on the separation region CT to a shallower depth than the first part 182 of the contact 180 on the first region I. As a result, an excessive size of the source/drain contact may be prevented from being formed on the separation region CT, e.g., as the second part 184 has a shallower depth due to use of the separation structure 150. As such, a parasitic capacitance between the contact 180 and an adjacent contact in the second region II may be reduced, and a semiconductor device with improved performance may be provided.

By way of summation and review, aspects of embodiments provide a semiconductor device with improved performance. Aspects of embodiments also provide a fabricating method capable of fabricating the semiconductor device with improved performance. That is, according to embodiments, by replacing the interlayer insulating layer above the separation region CT with the separation structure 150, e.g., SiN, it is possible to prevent an excessive size of the source/drain contact from being formed on the separation region CT. As a result, the parasitic capacitance between the contact and the contact adjacent thereto may be reduced, and a method for fabricating the semiconductor device with improved performance can be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a fin type pattern extending in a first direction on a substrate;
a first gate electrode extending in a second direction intersecting with the first direction on the fin type pattern;
a source/drain region on a side wall of the first gate electrode, the source/drain region being in the fin type pattern;
a separation structure extending in the first direction on the substrate, the separation structure including a first trench, and the separation structure being spaced apart from the fin type pattern and separating the first gate electrode;
an interlayer insulating layer on a side wall of the separation structure, the interlayer insulating layer covering the source/drain region, and the interlayer insulating layer including a second trench having a lower surface lower than a lower surface of the first trench of the separation structure; and
a contact connected to the source/drain region, the contact being on the interlayer insulating layer and on the separation structure, and the contact filling the first trench of the separation structure and the second trench of the interlayer insulating layer.

2. The semiconductor device as claimed in claim 1, further comprising a field insulating layer on the substrate, the field insulating layer surrounding a part of a side wall of the fin type pattern, and the separation structure being on the field insulating layer.

3. The semiconductor device as claimed in claim 1, further comprising a gate dielectric layer between the fin type pattern and the first gate electrode, the gate dielectric layer not extending along the side wall of the separation structure.

4. The semiconductor device as claimed in claim 1, wherein a height of the lower surface of the first trench is lower than a height of an upper surface of the interlayer insulating layer.

5. The semiconductor device as claimed in claim 1, further comprising a second gate electrode on the fin type pattern, the second gate electrode being spaced apart from the first gate electrode and extending in the second direction, and the second gate electrode being separated by the separation structure.

6. The semiconductor device as claimed in claim 1, wherein the separation structure includes silicon nitride.

7. The semiconductor device as claimed in claim 1, further comprising a capping pattern extending in the second direction on the first gate electrode, the separation structure separating the capping pattern.

8. The semiconductor device as claimed in claim 7, further comprising a hard mask layer on the separation structure, on the interlayer insulating layer, and on the capping pattern, the contact extending through the interlayer insulating layer and through the hard mask layer to be connected to the source/drain region.

9. The semiconductor device as claimed in claim 8, wherein the hard mask layer includes TEOS (tetraethyl orthosilicate).

10. The semiconductor device as claimed in claim 1, further comprising a barrier metal layer extending along the lower surface and a side wall of the first trench, and along the lower surface and a side wall of the second trench, the contact being on the barrier metal layer.

11. A semiconductor device, comprising:
a first fin type pattern extending in a first direction on a substrate;
a second fin type pattern on the substrate, the second fin type pattern being spaced apart from the first fin type pattern and extending in the first direction;
a field insulating layer between the first fin type pattern and the second fin type pattern, the field insulating layer being on the substrate;
a separation structure extending in the first direction on the field insulating layer;
a first source/drain region on the first fin type pattern;
an interlayer insulating layer on a side wall of the separation structure, the interlayer insulating layer covering the first source/drain region; and
a contact on the interlayer insulating layer and on the separation structure, the contact being connected to the first source/drain region,
wherein the separation structure includes a first trench having a lower surface lower than an upper surface of the interlayer insulating layer,
wherein the interlayer insulating layer includes a second trench having a lower surface lower than the lower surface of the first trench, and
wherein the contact fills the first trench and the second trench.

12. The semiconductor device as claimed in claim 11, further comprising:
a first gate structure extending in a second direction intersecting with the first direction, on the first fin type pattern; and
a second gate structure extending in the second direction, on the second fin type pattern,
wherein the first gate structure and the second gate structure are separated by the separation structure.

13. The semiconductor device as claimed in claim 12, wherein each of the first gate structure and the second gate structure includes:
a gate dielectric layer which extends along an upper surface of the field insulating layer and does not extend along the side wall of the separation structure; and
a gate electrode on the gate dielectric layer.

14. The semiconductor device as claimed in claim 11, further comprising a second source/drain region on the second fin type pattern, the contact being connected to the first source/drain region and the second source/drain region.

15. The semiconductor device as claimed in claim 11, further comprising:
a third fin type pattern extending in the first direction on the substrate, the first fin type pattern being between the second fin type pattern and the third fin type pattern; and
a third source/drain region on the third fin type pattern, the contact being connected to the first source/drain region and the third source/drain region.

16. A semiconductor device, comprising:
a fin type pattern extending in a first direction on a substrate;
a first gate electrode extending in a second direction intersecting with the first direction on the fin type pattern;

a first source/drain region on a side wall of the first gate electrode, the first source/drain region being in the fin type pattern;

a separation structure on the substrate, the separation structure being spaced apart from the fin type pattern and extending in the first direction; and a contact connected to the first source/drain region, the contact being on the first source/drain region and on the separation structure, wherein the separation structure includes a first separation part which separates the first gate electrode, and a connection part which overlaps the contact, and wherein an upper surface of the connection part is lower than an upper surface of the first separation part.

17. The semiconductor device as claimed in claim 16, further comprising an interlayer insulating layer which covers the first source/drain region, on a side wall of the separation structure, the connection part separating the interlayer insulating layer.

18. The semiconductor device as claimed in claim 17, wherein the upper surface of the first separation part is on substantially a same plane as an upper surface of the interlayer insulating layer.

19. The semiconductor device as claimed in claim 16, further comprising a second gate electrode on the fin type pattern, the second gate electrode being spaced apart from the first gate electrode and extending in the second direction, wherein the separation structure further includes a second separation part which separates the second gate electrode, and wherein an upper surface of the second separation part is higher than the upper surface of the connection part.

20. The semiconductor device as claimed in claim 19, wherein the connection part connects the first separation part and the second separation part.

* * * * *

UNITED STATES PATENT AND TRADEMARK OFFICE
CERTIFICATE OF CORRECTION

| | | |
|---|---|---|
| PATENT NO. | : 11,195,833 B2 | Page 1 of 1 |
| APPLICATION NO. | : 16/218796 | |
| DATED | : December 7, 2021 | |
| INVENTOR(S) | : Joong Gun Oh et al. | |

It is certified that error appears in the above-identified patent and that said Letters Patent is hereby corrected as shown below:

In the Claims

Column 19, Claim 1:
On Line 8, replace "in" with "on".

Column 20, Claim 12:
On Lines 8-9, replace "wherein the first gate structure and the second gate structure are" with "wherein each of the first gate structure and the second gate structure is".

Column 21, Claim 16:
On Line 2, replace "in" with "on".

Column 22, Claim 18:
On Lines 2-3, replace "the upper surface of the first separation part is on substantially a same" with "the upper surface of the first separation part is substantially on the same".

Signed and Sealed this
Twenty-ninth Day of April, 2025

Coke Morgan Stewart
*Acting Director of the United States Patent and Trademark Office*